United States Patent [19]

Yamakawa

[11] Patent Number: 4,700,206

[45] Date of Patent: Oct. 13, 1987

[54] IMAGE FORMATION APPARATUS

[75] Inventor: Tadashi Yamakawa, Yokohama, Japan

[73] Assignee: Canon Kabushiki Kaisha, Tokyo, Japan

[21] Appl. No.: 4,318

[22] Filed: Jan. 8, 1987

Related U.S. Application Data

[63] Continuation of Ser. No. 663,666, Oct. 22, 1984.

[30] Foreign Application Priority Data

| | | | |
|---|---|---|---|
| Oct. 25, 1983 | [JP] | Japan | 58-200568 |
| Oct. 25, 1983 | [JP] | Japan | 58-200569 |
| Oct. 25, 1983 | [JP] | Japan | 58-200570 |
| Nov. 4, 1983 | [JP] | Japan | 58-207771 |
| Nov. 4, 1983 | [JP] | Japan | 58-207772 |
| Nov. 29, 1983 | [JP] | Japan | 58-225066 |
| Feb. 4, 1984 | [JP] | Japan | 59-17656 |

[51] Int. Cl.$^4$ ............................................. G01D 15/14
[52] U.S. Cl. ...................................... 346/160; 346/108
[58] Field of Search ................... 346/154, 160, 170 R, 346/108, 76 L; 358/298, 300, 302; 101/DIG. 13; 362/800; 400/119; 369/125; 355/1

[56] References Cited

U.S. PATENT DOCUMENTS

| | | | |
|---|---|---|---|
| 4,415,913 | 11/1983 | Diddens | 358/298 |
| 4,455,562 | 6/1984 | Dolan et al. | 346/160 |
| 4,467,367 | 8/1984 | Ohaka et al. | 358/298 |
| 4,521,790 | 6/1985 | Allard | 358/298 |
| 4,525,729 | 6/1985 | Agulnek et al. | 346/160 |

Primary Examiner—Arthur G. Evans
Attorney, Agent, or Firm—Fitzpatrick, Cella, Harper & Scinto

[57] ABSTRACT

An image formation apparatus has a photosensitive drum or photosensitive paper sheet for forming a dot image thereon, a printer head having an LED array, and LED drive ICs for selectively driving the LEDs. Dot width in the subscanning direction is properly controlled to form an excellent pseudo halftone image. A cylindrical lens or the like can be inserted between the LED array and the drum so as to prevent formation of black or white stripes in white or black image portions.

22 Claims, 38 Drawing Figures

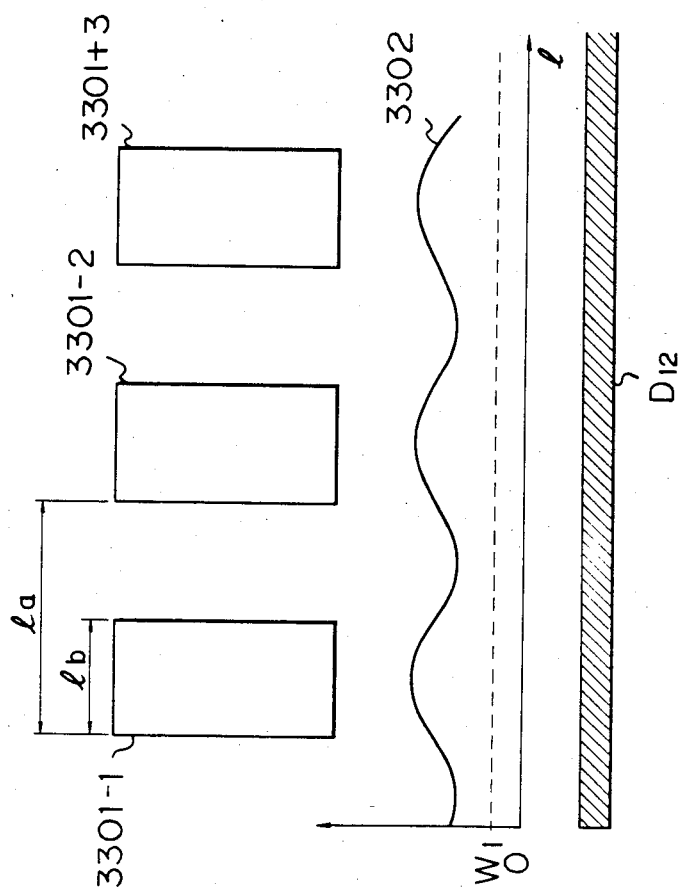

IMAGE FORMATION APPARATUS

This application is a continuation of application Ser. No. 663,666 filed 10/22/84.

BACKGROUND OF THE INVENTION

1. Field of the Invention

The present invention relates to an image formation apparatus which uses a plurality of light emitting elements and forms an image on a photosensitive body and, more particularly, to an image formation apparatus in which elements such as light emitting diodes (LEDs) are arranged in one or a plurality of arrays and these elements are selectively driven to form a dot image on the photosensitive body.

2. Description of the Prior Art

FIG. 1 schematically shows the configuration of an LED printer for forming an image using a plurality of LEDs.

A photosensitive drum 101 is driven to rotate in the direction indicated by arrow a. A primary charger 102 uniformly charges the surface of the photosensitive drum 101. An LED printer head 103 forms a light spot on only a portion of the surface of the photosensitive drum 101 from which the charge is removed. The charge on the remaining portion of the surface of the photosensitive drum 101 remains. In other words, an electrostatic latent image is formed. When the image-bearing surface of the drum 101 passes by a developing unit 104, the toner is attached or not attached to the image or non-image portion of the surface of the drum 101 in accordance with the surface potential, thereby forming a visible or toner image on the surface of the drum 101. In the process described above, whether or not the toner is attached on the portion of the drum 101 irradiated with a light spot by the LED printer head 103 can be arbitrarily determined in accordance with the polarity of the charger 102 and the polarity of the toner held in the developing unit 104. The toner image passed through the developing unit 104 is transferred by a transfer charger 105 onto a paper sheet supplied from a cassette 106 or 107. When the paper sheet is passed through a fixing unit 108, the toner image on the drum 101 is fixed. A cleaner 109 removes the residual toner from the drum 101, and a discharge lamp 110 discharges the residual charge on the drum 101.

FIG. 2 is a perspective view of an LED array board 201 constituting the LED printer head 103. A substrate 202 serves as a radiating fin, and wiring means 203, 204 and 205 comprise ceramic substrates. Cables 206 and 207 transmit image signals and are connected to a power source. LED array chips 208-$l$ to 208-$n$ have an array of LEDs at their centers. Drivers 209-$l$ to 209-$n$ and 210-$l$ to 210-$n$ are drivers for the LED array chips 208-$l$ to 208-$n$, i.e., LED drive integrated circuits (to be referred to as LED ICs hereinafter) having built-in serial-to-parallel converters of the image signals received through the cables 106 and 107, and the like. FIG. 3 shows an enlarged portion of the LED array chip 208-$m$ and the LED drive ICs 209-$m$ and 210-$m$. LEDs 301-1, 301-2, 301-3, 301-4 and so on are arranged in an array at substantially the center of the LED array chip 208-$m$. The odd-numbered LEDs 301-1, 301-3 and so on are wired to the upper side, while the even-numbered LEDs 301-2, 302-4, and so on are wired to the lower side. The LEDs are then wire-bonded to LED drive terminals 302-1, 302-2, . . . , 303-1, 303-2, . . . +# of the LED drive ICs C209-$m$ and 210-$m$.

The LED array board 210 has the arrangement as described above. After image signals of one array are supplied to the LED drive ICs 209-$l$ to 209-$n$ and 210-$l$ to 210-$n$ through the cables 206 and 207 and the data of one array is shifted, the shifted data is parallel-produced to the LED drive terminals 302-1, 302-2, . . . , 303-1, 303-2, . . . . Then, the respective LEDs are turned on or off to generate light spots corresponding to image signals of one array.

FIG. 4 shows the relationship between the LED light emitting portion and the drum image forming point. The LED array chip 208-$m$ forms an image on the photosensitive drum 101 through an imaging optical system 401 such as a focusing light guide. Light rays L1 from the LED 301-1 at an angle $\theta$ become light ray L(1-$t$) in the imaging optical system 401 when the angle $\theta$ is small. However, when the angle $\theta$ is increased, the light rays are partially cut off. Only the light rays L(1-$t$) which are incident on the system 401 are transmitted to the drum 101 and form an image. The light distribution characteristics of the LED 301-1 are as shown in FIG. 5; the flux density is high up to a region wherein the angle $\theta$ is relatively great. Assuming that the light rays emitted from a light emitting element having light distribution characteristics substantially equivalent to a sphere become incident on the system 401 when the angle is up to $\theta$ and do not become incident on the system 401 when the angle exceeds $\theta$, the ratio of the output optical energy of the light emitting element to the input energy thereto is calculated and is shown in Table 1 below:

TABLE 1

| Angle $\theta$ (°) | 10 | 15 | 20 | 25 | 30 | 35 | 40 | 45 |
|---|---|---|---|---|---|---|---|---|
| Efficiency (%) | 5.9 | 12.9 | 22.0 | 32.5 | 43.8 | 55.0 | 65.6 | 75.0 |

With an imaging optical system 401 currently available having a relatively great angle $\theta$, distances li and lo are 3 mm, distance lc is about 9 mm, and $\theta$ is about 15°, in FIG. 4. Therefore, even light attenuation through the imaging optical system 401 is not considered, only about 13% of the total optical energy emitted from the LED 301-1 reach the drum 101.

FIG. 6 shows the LED light emitting portion including an LED chip 501, an effective light emitting surface 502, an electrode 503, and a connecting surface 504 between the electrode and the LED. As has been described above, the LED has the light distribution characteristics as shown in FIG. 5 when the direction perpendicular to the effective light emitting surface 502 is determined as 0°. The light output is assumed to be substantially proportional to the current density at the p-n junction below the effective light emitting surface 502. Since the LED light emitting surfaces corresponding to respective pixels are arranged in an array, one side of the effective light emitting surface 502 of each LED is set to be smaller than the pixel pitch so as to allow discrimination of boundaries between the adjacent pixels. For example, in an LED array having 10 pixels per mm, the pixel pitch is 100 $\mu$m, while the effective light emitting surface has dimensions of 80 $\mu$m $\times$ 80 $\mu$m. Thus, 20 $\mu$m is set at a boundary between the pixels. Meanwhile, in order to form a clear digital image, 16 or more pixels must be formed per mm. In this case, the pixel pitch becomes 62.5 $\mu$m, and the effective light emitting surface has dimensions of about 40 $\mu m \times 40$ $\mu m$. In this manner, when the pixel density is increased from 10 pels/mm to 16 pels/mm (1.6 times), the effective light emitting surface area is reduced to ¼ the original area.

As shown in FIG. 2, in a system wherein drive ICs are mounted together with LED array chips and each of the LED arrays is simultaneously driven, if the process speed is kept the same, the ON time for one pitch when the pixel density is 16 pel/mm is shortened to 1/1.6 as compared to the case of the pixel density of 10 pels/mm. Therefore, if the drum sensitivity is kept the same, the illuminance per unit area when the pixel density is 16 pels/mm must be 1.6 times that with the pixel density of 10 pels/mm. When the pixel density is 16 pels/mm, the area per pixel is $(1/1.6)^2$ that when the pixel density is 10 pels/mm. Therefore, the light emission output per pixel of the light emitting portion having a pixel density of 16 pels/mm becomes 1/1.6 that of a light emitting portion having the pixel density of 10 pels/mm. Therefore, as has been described above, when the pixel density is 16 pels/mm, the effective light emitting surface area is ¼ that when the pixel density is 10 pels/mm. Therefore, the current density of each LED in a light emitting portion having a pixel density of 16 pels/mm is 2.5 times that of an LED in a light emitting portion having a current density of 10 pels/mm since $(1/1.6)/(¼)=2.5$.

In order to reduce the number of drivers used and to reduce the cost, a drive method is often used wherein an $n \times m$ matrix of LED array chips is arranged, and an array of n LEDs are simultaneously driven by m time division. In this method, when the pixel density is increased from 10 pels/mm to 16 pels/mm and the number of LEDs to be driven simultaneously is determined to be n, the time division number becomes 1.6 times that when the pixel density is 10 pels/mm. Therefore, in this case, if the process speed is kept the same, the time corresponding to one pitch, i.e., the time for forming one dot is shortened to $(1/1.6)^2$ as compared to that when the pixel density is 10 pels/mm. Therefore, in this case, the light emission output per pixel of the light emitting portion becomes the same for either pixel density of 10 pels/mm or 16 pels/mm, and the current density for each LED when the pixel density of 16 pels/mm becomes four times that when the pixel density is 10 pels/mm.

The higher the current density, the lower the light emission efficiency of an LED. The higher the current density, the shorter the life of the LED. In addition, it is known that due to various problems encountered in the manufacture when the pixel density is increased, the light emission efficiency is reduced.

More specifically, when the pixel density is increased, the light emission efficiency is decreased. Then, the current density must be increased. As has been described above, in order to increase the pixel density to 1.6 times the original value, the current density must also be increased to 2.5 to 4 times the original value. With such an increase in the current density, the life of LEDs is reduced.

In this manner, when an image of an LED light emitting surface is formed on a drum surface by an imaging system using an LED array chip, only about 10% of the total optical energy of the LEDs can be used. Therefore, in order to increase the quantity of light, the drive current of the LED must be increased. For this reason, the power consumption of the LED array chips 208-*l* to 208-*n* and the LED drive ICs 209-*l* to 209-*n* and 210-*l* to 210-*n* is increased. Furthermore, ICs having higher driving capacities must be used. The substrate 202 serving as a radiating fin must be large, resulting in a higher cost and a bulky system.

FIG. 7 shows a mounting example of the imaging optical system 401. A mounting L-shaped block 505 is fixed to the substrate 202. The bottom and side walls of the imaging optical system 401 are fixed to inner surfaces 505' and 505" of the L-shaped block 505 with screws.

However, as described above, the light emission efficiency of the LEDs must be increased by using a focusing light guide array having a large angle $\theta$. However, such a focusing light guide array having distances li and lo of 3 mm and distance lc of about 9 mm has a very large depth of field and allows formation of a clear image only within a focus error within $\pm 100$ $\mu m$.

A focusing light guide array consists of a bundle of focusing rod lenses. Therefore, when an image of a small array such as LED light emitting surfaces is to be formed, if the array of LEDs is deviated from the central array of the bundle of lenses in a direction parallel thereto, the imaging surface has an undesirable density pattern at a pitch corresponding to the diameter of the focusing rod lenses.

As can be seen from FIG. 7, when thin films or the like are inserted between the inner surfaces 505' and 505" of the L-shaped block 505 and the focusing light guide array, the light emitting surfaces and the centers of the focusing light guides can be correctly adjusted at both sides of the array. However, the focusing light guide array has a dimension of 9 mm in the direction parallel to the optical axis thereof and a dimension of 4 mm in the vertical direction. The focusing light guide array must have a length of at least 300 mm in order to allow printing to a size of up to A3 size. Therefore, the portion near the center of the focusing light guide array is distorted. At times, it is difficult to keep the deviation between the center of the L-shaped block and that of the focusing light guide array within $\pm 100$ $\mu m$. If a focusing light guide array is to be mounted with a good precision, a considerable cost increase cannot be avoided.

The light emitting surface of the conventional LED printer has the same width in the main scanning direction and in the subscanning direction as shown in FIG. 6. In particular, the light emitting surface width in the subscanning direction is set to be substantially the same as the dot pitch since the adjacent light emitting surface need not be formed.

In a printer of this type, a drum is rotated at a predetermined speed such that the array of light emitting surfaces and a photosensitive body, i.e., the surface of a photosensitive drum move relative to each other at a predetermined speed. Each time the light emitting surface array and the photosensitive body move for a distance corresponding to the dot pitch, a light emitting pattern of an array is switched to form a dot image. When a dot image of each array is formed, a correct black-and-white image can be formed with binary values of 0 and a predetermined value (corresponding to irradiated and non-irradiated portions of the photosensitive drum surface) if the light pattern is instantaneously emitted and if the light of the same shape as the light emitting surface is irradiated onto the photosensitive drum and the light emitting surface emits uniform light.

However, it is difficult to adopt a system wherein a light pattern is instantaneously emitted. The reason for this is as follows. When a single photosensitive drum is used, the required quantity of light is determined to be a product of illuminance and irradiation time. Therefore, when the light emitting time is reduced to 1/n, the illuminance must be increased to n times. This means that, in an LED array, a current which is n times the original current must be flowed, and a high current switching must be performed. In view of this, in general, a method is adopted wherein each light emitting element is turned on exceeding a predetermined period of time. In particular, in an LED array wherein driver chips are mounted on a head as shown in FIG. 2, the light emitting surface to be turned on is kept ON and the light emitting surface to be turned off is kept OFF while the light emitting surface array and the photosensitive drum move relative to each other for a distance corresponding to the dot pitch.

In this case, the light emitting surface width in the subscanning direction is substantially the same as the dot pitch. For this reason, the size and density of dots in the subscanning direction largely vary in accordance with variations in the illuminance of each light emitting surface.

These variations in the size and density of dots present a significant problem, particularly in a printer wherein the dot diameter during printing in the subscanning direction is changed in accordance with the length of ON time of each light emitting surface so as to provide a pseudo halftone image.

SUMMARY OF THE INVENTION

It is an object of the present invention to provide an image formation apparatus which is free from various problems associated with a low utilization efficiency of light emission energy, which has a compact construction and which is inexpensive.

It is another object of the present invention to provide an image formation apparatus which can form a clear image with no density irregularities by adopting a highly reliable imaging optical system at low cost.

It is still another object of the present invention to provide an image formation apparatus which can reduce variations in the size and density of dots in the subscanning direction upon the ON/OFF operation of each light emitting surface during image formation and which can control gray levels by adjusting the width of each dot in the subscanning direction to form a pseudo halftone image of excellent quality.

The above objects, features and advantages of the present invention will become apparent from the following description taken in conjunction with the accompanying drawings.

DETAILED DESCRIPTION OF THE PREFERRED EMBODIMENTS

Figure 8:
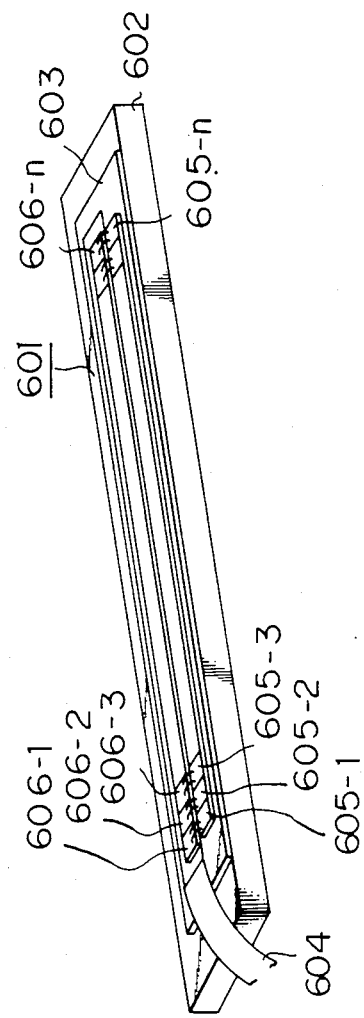
FIGS. 8 and 9 are schematic views showing the construction of an LED array board according to the present invention.
Figure 9:
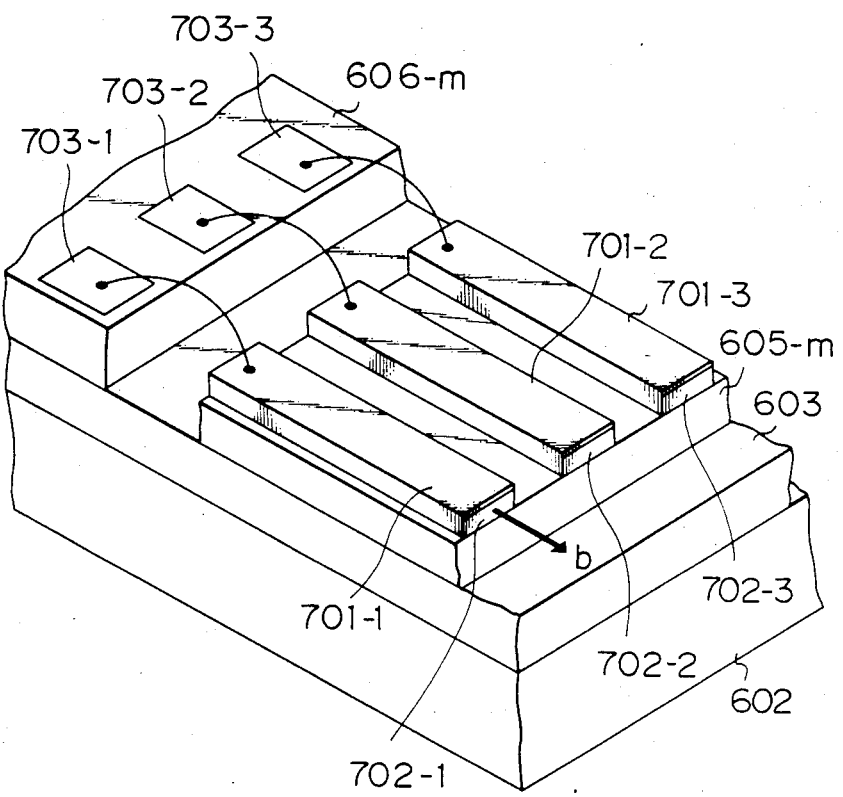

FIG. 8 is a perspective view showing an LED array board 601 as an example of a light emitting element to be used in the present invention. A substrate 602 serves as a radiating fin. A wiring means 603 comprises a ceramic substrate or the like. A cable 604 is for transmitting image signals and is for connection with a power source. A plurality of LED array chips 605-1, 605 2, and so on have an array of LEDs of end face light emitting type. LED drive ICs 606-1, 606-2, and so on drive the LED array chips 605-1, 605-2 and so on. Each LED drive IC has a serial-to-parallel converter for the image signal received through the cable 604, and the like. FIG. 9 shows an enlarged portion of the LED array chip 605-m and the LED drive IC 606-m.

The LED array chip 605-m is a monolithic LED array wherein end face light emitting type LEDs 701-1, 701-2 and so on are arranged in an array. The p-n junctions of the LEDs 701-1, 701-2, and so on are parallel to the adhering surface between the LED array chip 605-m and the wiring means 603. Light incident in the direction perpendicular to the p-n junctions are produced from end faces 702-1, 702-2, 702-3, and so on in the direction of arrow b. The electrodes of the LEDs 701-1, 701-2 and so on are on the upper surfaces and are wire-bonded to LED drive terminals 703-1, 703-2, and so on.

Figure 1:
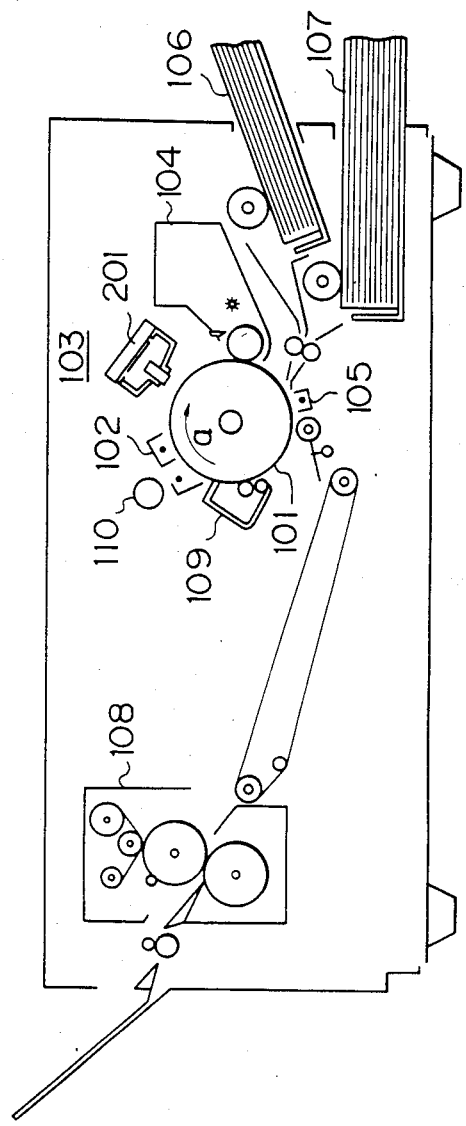
FIG. 1 is a schematic view showing the construction of a conventional LED printer.
Figure 2:
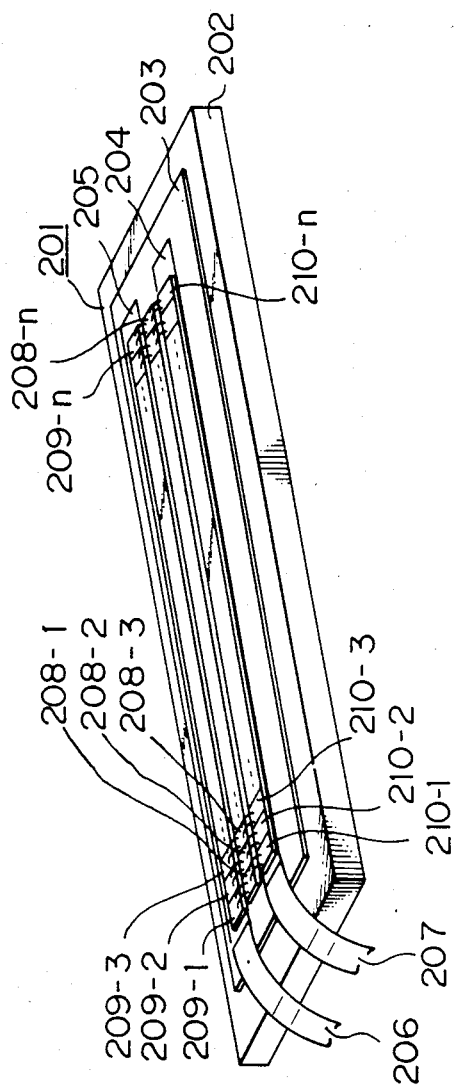
FIGS. 2 and 3 are schematic views showing the construction of a conventional LED printer head.
Figure 3:
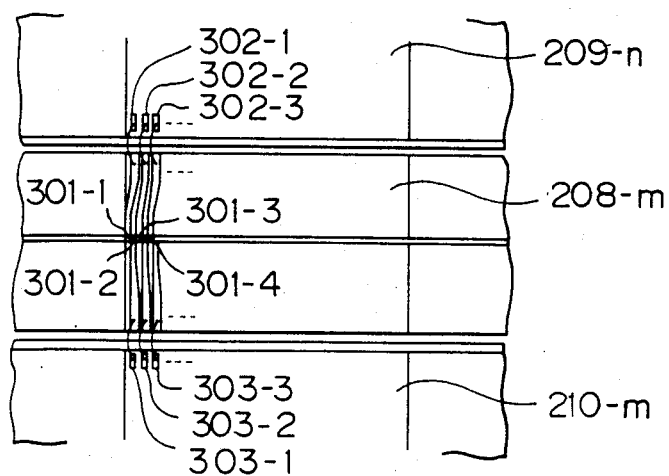
Figure 5:
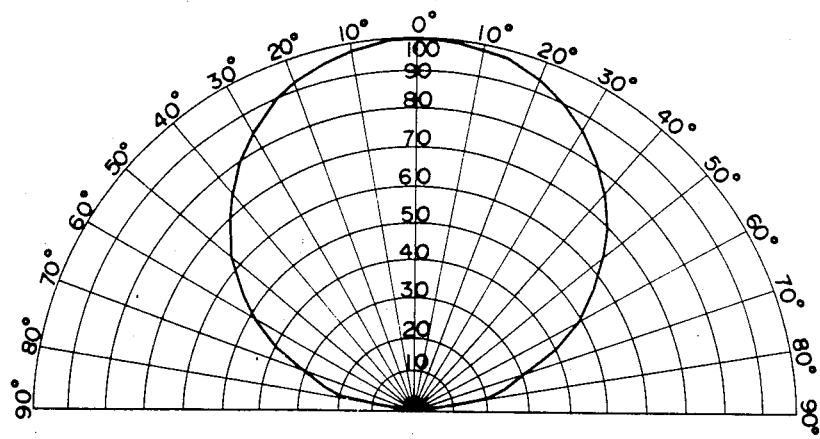
FIG. 5 is a representation showing the light distribution characteristics of a conventional LED.
Figure 4:
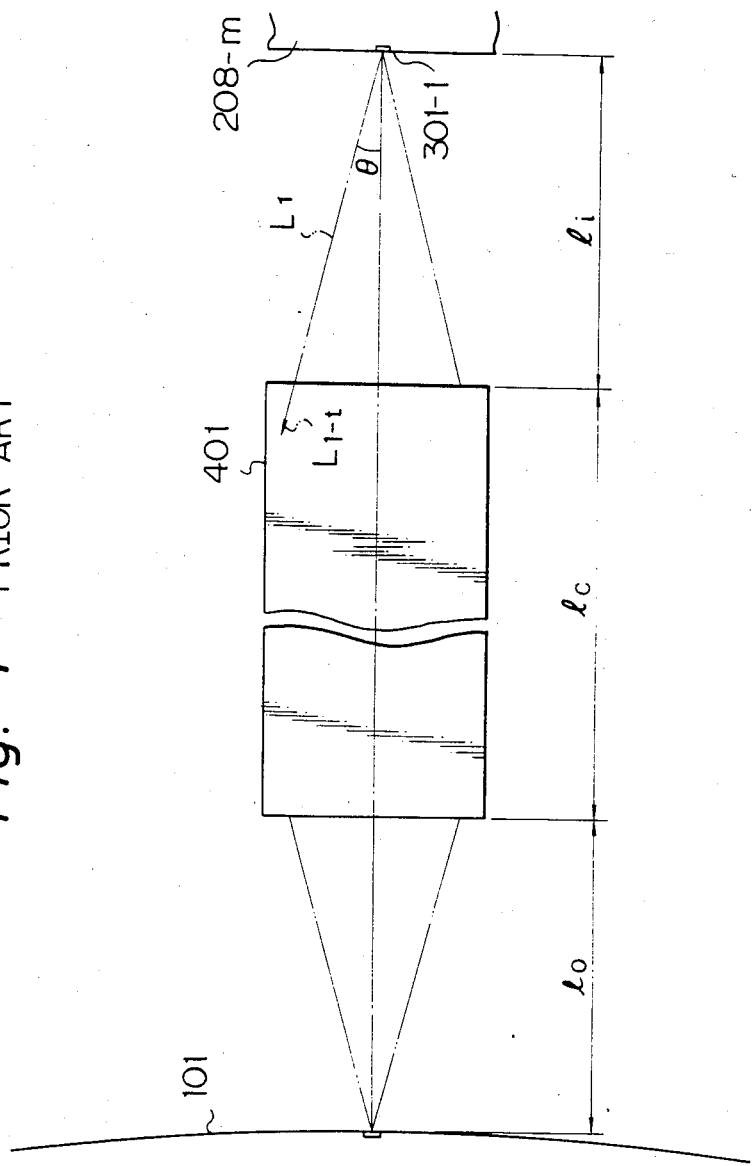
FIG. 4 shows the relationship between an LED light emitting portion and an imaging state of a photosensitive drum in a conventional LED printer.
Figure 6:
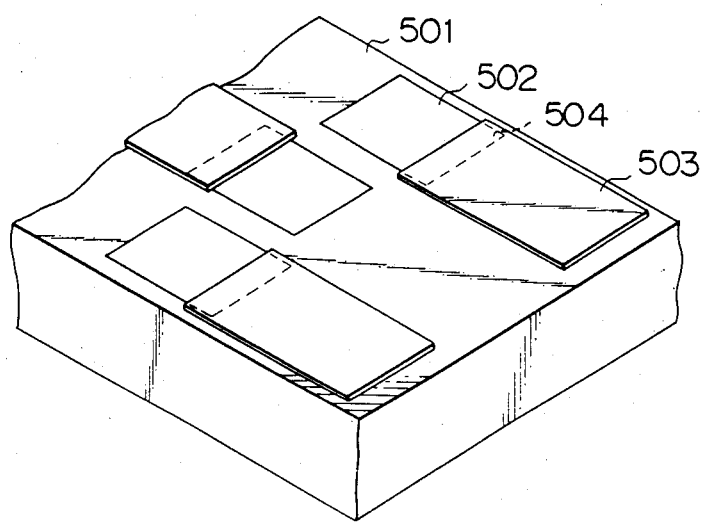
FIG. 6 is a partial perspective view showing the shape of a light emitting surface of a conventional LED array.
Figure 7:
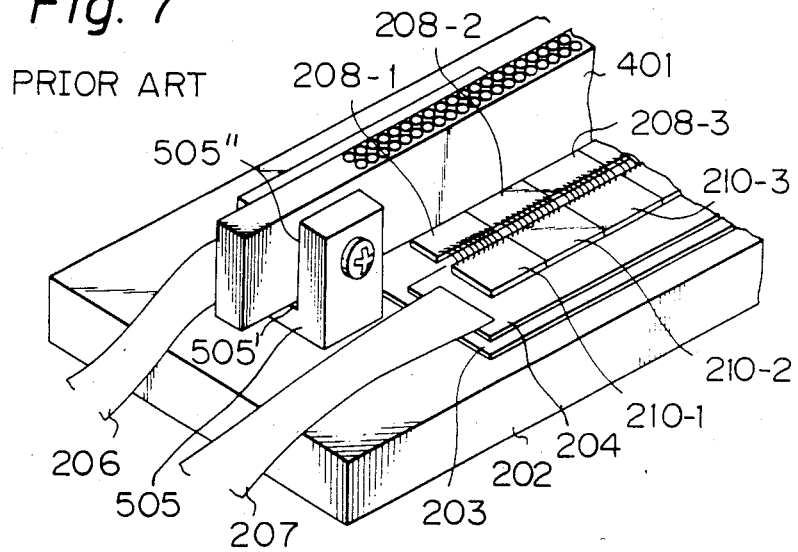
FIG. 7 is a partial perspective view showing the mounting method of an imaging optical system in a conventional LED printer.
Figure 10:
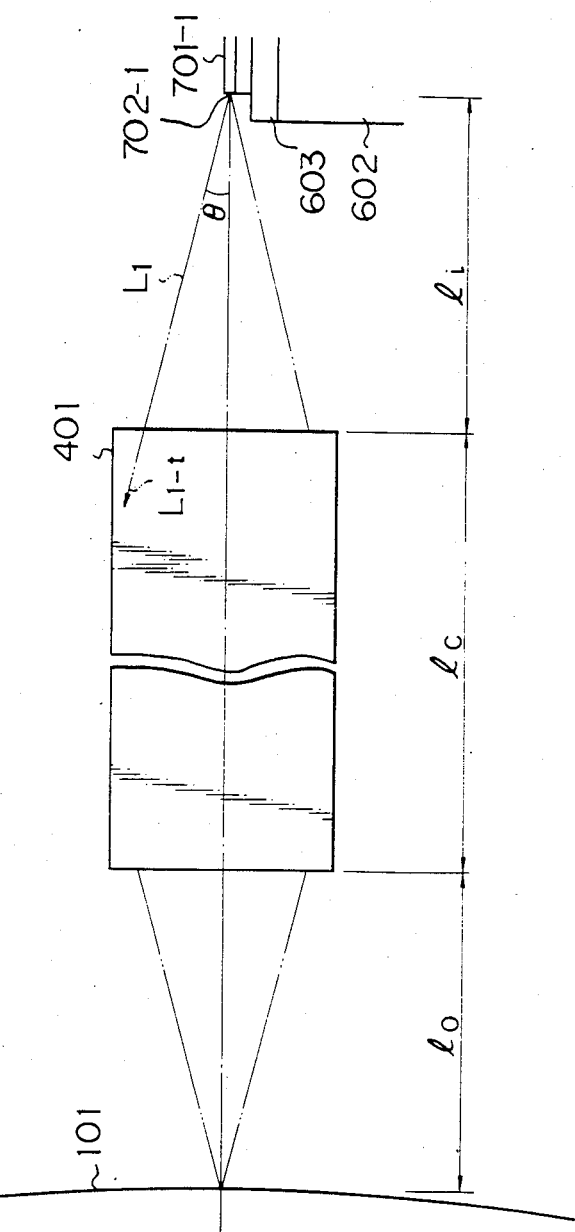
FIG. 10 shows the relationship between an LED light emitting portion and a photosensitive drum according to one embodiment of the present invention.
Figure 11:
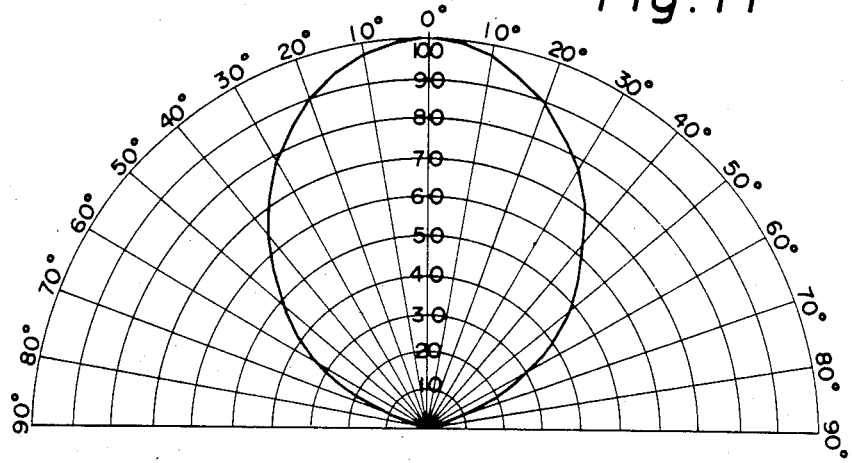
FIG. 11 is a representation showing the light distribution characteristics of an LED used in the present invention.

FIG. 10 shows the relationship between a light emitting surface 702-1 of the LED 701-1 and an imaging point on the surface of the photosensitive drum 101. FIG. 10 is basically the same as that shown in FIG. 4 except that the shape of the LED as the light emitting portion is different. The photosensitive drum is rotated by a means (not shown), and is moved in a direction substantially perpendicular to the direction of array of LEDs. In other words, even when end face light emitting type LEDs are used, the imaging mode of the light emitting surface remains the same as in the conventional apparatus. The LED 701-1 has the light distribution characteristics as shown in FIG. 11; as the angle $\theta$ increases, the light flux density is abruptly decreased. In this manner, when LEDs are arranged in the end face light emission mode, light emission is concentrated relatively in a direction perpendicular to the light emitting surface and not much light is emitted in other deviated directions. Assuming that light rays from a light emitting element having such light distribution characteristics become all incident on the imaging optical system 401 up to the angle $\theta$ and do not become incident thereon above the angle $\theta$, the ratio of the output optical energy to all the input energy of the light emitting element is calculated and the obtained results are shown in Table 2 below.

TABLE 2

| Angle $\theta$ (°) | 10 | 15 | 20 | 25 | 30 | 35 |
|---|---|---|---|---|---|---|
| Efficiency (%) | 8.5 | 18.1 | 29.8 | 42.6 | 55.3 | 66.9 |

When end face light emitting type LEDs are used in this manner, if an imaging optical system 401 havinq an angle $\theta$ of about 15° is used, about 18.1% of the input energy can be irradiated onto the surface of the photosensitive drum 101. If the sensitivity of the drum 101 is kept the same as that of the conventional case, a drive current for driving the LED 701-1 can be about 70% the conventional case.

In order to form an image with no irregularities, variations in the size of the effective light emitting surface must be reduced such that all the LED light emitting surfaces have the same size. In order to form individual LEDs on a single chip, in a conventional LED array chip, a monolithic LED array must be formed by the chemical vapor deposition method. For this purpose, an LED material, GaAsP, which has only a low light emission efficiency must be used. However, in the LED array chip to be used in the present invention, as shown in FIG. 9, the p-n junctions of the LEDs are cut to isolate the LEDs so as to provide an LED array chip 605-m having a plurality of LED light emitting surfaces 702-1, 702-2 and so on. For this reason, a plurality of LEDs need not be formed on a single chip by the chemical vapor deposition method. Thus, grooves or channels for removing the p-n junctions are formed in the face of the large end of a light emitting LED chip formed by the chemical vapor deposition, thereby isolating a plurality of LEDs from each other. A monolithic LED array can be prepared with an LED material having a very high light emission efficiency such as GaAlAs. For this reason, the LED array of the present invention can provide an efficiency several times that of the conventional LED array. In order to obtain only the same quantity of light, the current required can be reduced to a fraction of that required in the conventional case.

In a conventional LED array board, the LED drive current is high. Therefore, the LED drive ICs must comprise bipolar transistors. In order to reduce the current consumption by other logic circuits such as one for serial-to-parallel conversion, an $I^2L$ logic must be used. Then, the drive frequency of the ICs is limited to about 1 kHz, and therefore a high-speed image formation cannot be performed. When a high-speed operation is to be performed, a single line must be divided into a plurality of segments, and image signals of these segments must be parallel-processed and each parallel signal is serially supplied to the LED array board. When this method is adopted, the input signals to the LED array board must be corrected by an expensive correction circuit.

However, according to the present invention, the drive current of LEDs can be set to be small, so that high-speed low-power consumption ICs can be used to drive LEDs. An input correction circuit is not required and the signals can be directly supplied to the LED array board.

In the conventional LED array, when the pixel density is increased, the p-n junction area per LED must be reduced. Even if the current per pixel or LED is kept the same, when the LED light emitting surface is reduced, the p-n junction area is reduced. This results in a an increase in current density and in short life. In view of this problem, the developing method has been limited to the negative developing method wherein the LEDs are not turned on for a long time and portions of photosensitive body which are irradiated with light are printed in black. However, when end face light emitting type LEDs are used as in the present invention, even if the light emitting surface area is reduced so as to increase the pixel density, the length of the LED from one end face to the other end face can be elongated so that the p-n junction area will remain the same. Therefore, the current density is not increased and the life can be prolonged. The present invention can therefore be adopted in an electrophotographic printer wherein positive developing is adopted which requires a long ON time of LEDs.

However, according to the present invention, since an end face light emitting type LED array is used in place of a conventional plane light emitting type LED array is used, the light spot generating plane must be located at an end portion of the board. However, when the end face light emitting type LED array chip 605-m is arranged in alignment with an end of the wiring means 603, the light emitting surfaces 702-1, 702-2 and so on appear at corners and are prone to damage. This presents the problem of difficult maintenance.

In view of this problem, in an embodiment shown in FIG. 9, the LED array is arranged at a position withdrawn from the end of the wiring means 603.

As can be seen from the imaging optical system shown in FIG. 10, a withdrawing distance lx of the LED array chip 605-m from the end of the wiring means 603 must satisfy:

$$lx \leq ly/\tan \theta$$

where ly is the height (the distance from the bottom surface of the LED array chip 605-m and the light emitting surface 702-1).

If the surface of the wiring means 603 is a mirror surface, an image corresponding to a virtual image of the mirror surface is formed on the surface of the drum 101. On the other hand, if the surface of the wiring means 603 is a scattering surface (white) having a high reflectivity, this introduces noise. Therefore, the surface of the wiring means 603 must be treated to absorb light. For this purpose, the surface of the wiring means 603 can be painted in black or a black material may be used as a material of the wiring means 603.

In this manner, when the LED array chip is arranged at a position slightly withdrawn from the end of the substrate and a means is provided for absorbing light incident on the surface of the substrate due to this withdrawn arrangement of the chip, an LED array printer can be obtained which allows easy maintenance.

Figure 12:
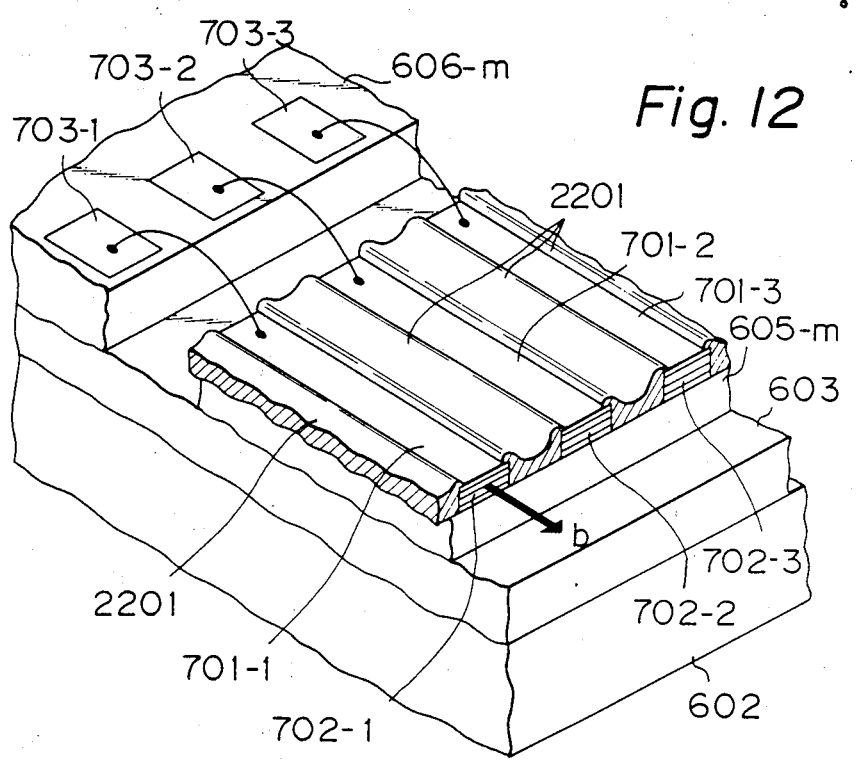
FIGS. 12 and 13 are schematic views showing another construction of an LED board according to the present invention.

FIG. 12 shows another embodiment of the end face light emitting type LED array according to the present invention. In the LED array as shown in FIG. 9, light is produced not only in the direction of arrow b but also in the direction perpendicular to this direction. Light leaked at the side surface also leaks in the direction of arrow b by reflection or the like from the grooves between the light emitting surfaces 702-1, 702-3 and 703. Then, the leaked light becomes a noise component, and separation between light from the light emitting surface for forming an image and reflected light from the light emitting surface is degraded. Clear printing cannot then be performed. In this embodiment, in order to solve this problem, a light absorbing member 2201 is coated so as to cover at least the LEDs 701-1, 701-2 and 701-3. This member 2201 can be formed by burying a light absorbing resin in a groove between the LED chips 605-n, or can be formed by deposition of such a light absorbing material.

Light absorption need only be effected within a wavelength range of the LEDs. Therefore, the member 2201 need not always consist of a black material. However, if a light absorbing resin is buried after the driver ICs and the LEDs are wired, an insulating material must be used.

In this manner, when a light absorbing member capable of absorbing light components of a wavelength range of the LEDs is buried, degradation in image quality due to light leakage from the side surfaces of the end face light emitting type LEDs can be prevented.

Figure 13:
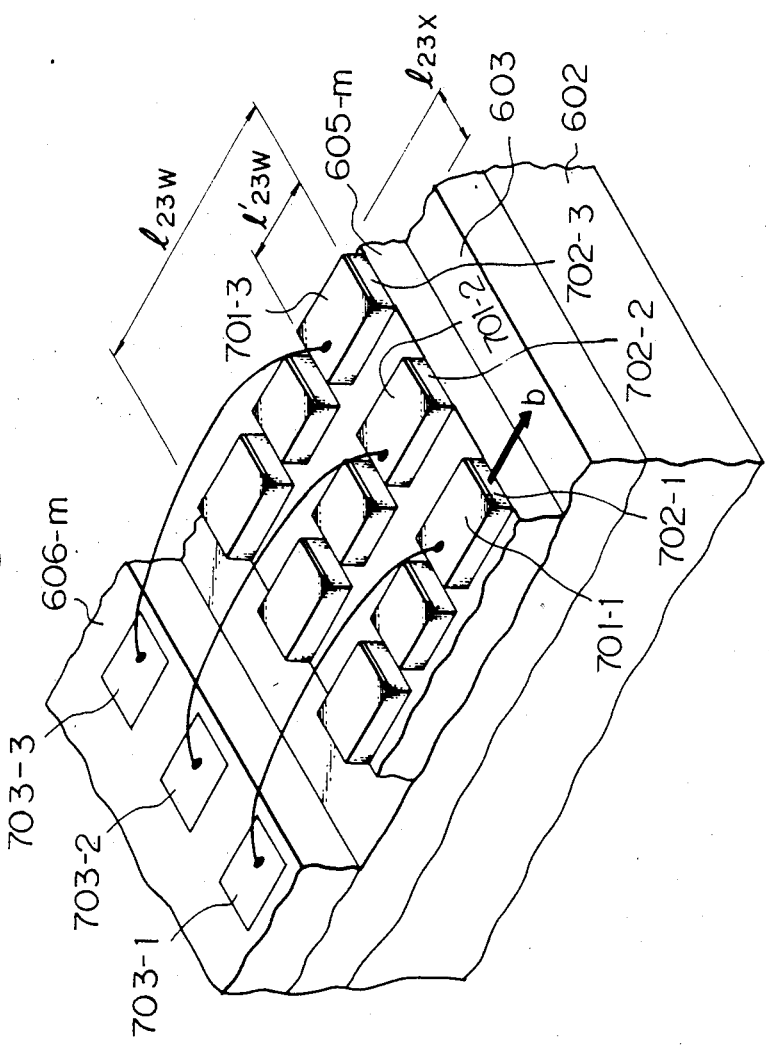

FIG. 13 shows still another embodiment of an end face light emitting LED array according to the present invention. In this embodiment, the light emission efficiency in the embodiment shown in FIG. 9 is improved further.

In the embodiment shown in FIG. 9, the entire width of the LED chip is an electrode. When the chip dimension in the LED is represented by 123W and the horizontal dimension of the light emitting surface of each LED is represented by 123x, the electrode area of a single LED becomes 123W×123x. In general, light produced in the direction of arrow b becomes stronger as the electrode area is increased. However, when the dimension 123W increases, light is emitted from the p-n junction behind the light emitting surface 702-1, i.e., the drive IC 606-n is produced from the light emitting surface 702-1 at a lower efficiency.

Then, even if the dimension 123W is increased above a predetermined value, the quantity of light emitted per unit area of the light emitting surface 702-1 remains substantially the same. However, the quantity of light emitted changes in proportion to the current density at the p-n junction. Therefore, the current per LED increases with an increase in the dimension 123W.

In other words, when the dimension 123W is increased, the current required for light emission is increased while the quantity of light remains substantially the same. Therefore, it is preferable to cut the LED chips to have a predetermined dimension 123W.

However, when two short LEDs are prepared, they are prone to damage and maintenance thereof is hard. Then, the step of mounting LEDs on the LED array board becomes cumbersome.

In order to provide a solution to this problem, as shown in FIG. 13, grooves are formed to remove the p-n junctions between the end face light emitting LEDs 701-1, 701-2, 701-3, and so on so as to extend parallel to the light emitting surfaces 702-1, 702-2, 702-3. Thus, each LED is divided into a plurality of regions in the output direction of the light. In FIG. 13, two grooves are formed. However, any number of grooves except for one groove can be formed. In this case, when the distance between the light emitting surface and the first groove in the rearward direction is represented by 123W' and only the region closest to the photosensitive drum is driven, the electrode area becomes 123W'×123x. Then, the current consumption per LED becomes 123W'/123W times that of the case shown in FIG. 9. However, when the dimension 123W' is selected properly, the quantity of light per LED can be increased considerably above 123W'/123x, that of the case shown in FIG. 9.

In this manner, when at least one groove is formed between the light emitting surfaces of the end face light emitting type LED array chip, an LED array of excellent light emission efficiency can be obtained. The LED array chip need not have too small dimensions, so that maintenance and handling of LEDs are facilitated.

Figure 14A:
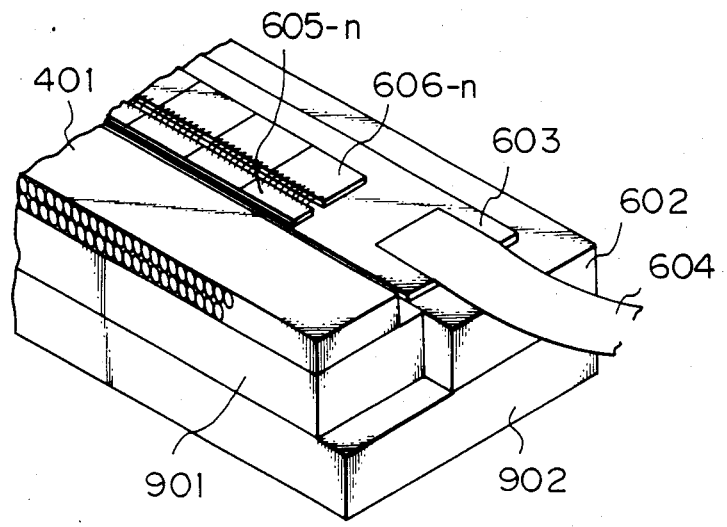
FIGS. 14(a) and 14(b) are schematic views showing a mounting method of an imaging optical system according to the present invention.
Figure 14B:
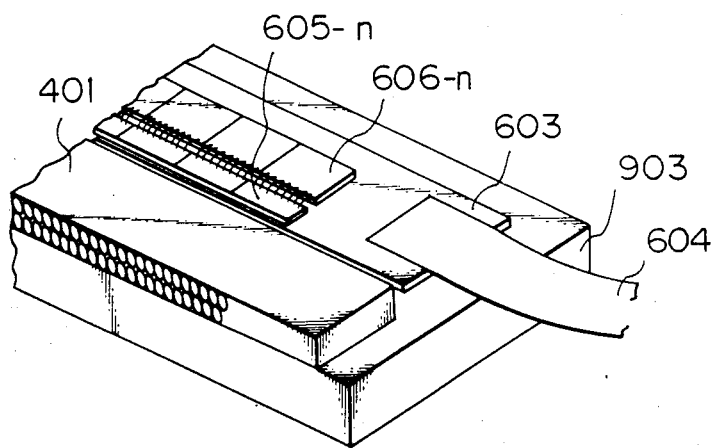

FIGS. 14(a) and 14(b) show a method for mounting the end face light emitting array and the imaging optical system as described above in an image formation apparatus according to the present invention. Referring to FIG. 14(a), an imaging optical system 401 comprising a focusing light guide or converging light transmitter guide adjusts the thickness of a height adjusting plate 901 such that the light emitting surface of each LED on an LED array chip 605-n is at the center of the bundle of focusing rod lenses of the array. After the conjugate points of the lenses are adjusted, a base 902, the imaging optical system 401, the height adjusting plate 901, and the LED array substrate 602 are fixed in position. The fixing process may be performed by screwing or adjustment of the conjugate points followed by injection of an adhesive in each junction. As shown in FIG. 14(b), the wiring means 603, the LED array chips 605-n, and the imaging optical system 401 can be mounted on an LED array board 903 extending at the side of the light emitting surfaces of the LEDs.

In this manner, when an end face light emitting LED array chip is used as an image forming light emitting element and one surface of an imaging optical system such as a focusing light guide is adhered to a plane parallel to the adhering surface of the focusing light guide array, a misalignment between the light emitting surface and the center of the bundle of the rod lenses of the focusing light array can be reduced.

Figure 15:
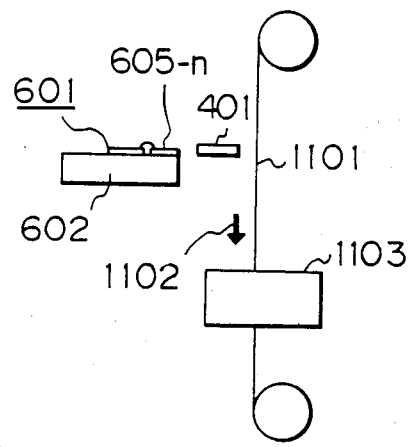
FIGS. 15 and 16 are schematic views showing another embodiment of the present invention.

An image formation apparatus according to the present invention is not limited to formation of an image on a photosensitive drum but can be used for directly forming an image on a photosensitive paper sheet. FIG. 15 shows such an embodiment. In this embodiment, a photosensitive paper sheet 1101 is opposed to an LED array board 601 in which end face light emitting type LED array chips 605-1 to 605-n are mounted on a substrate 602. In the imaging optical system 401, the light emitting surfaces of the LED array chips 605-1 to 605-n form an image on the photosensitive paper sheet 1101. The paper sheet 1101 is fed in the direction of arrow 1102 by a means (not shown). An image consisting of light spots formed corresponding to the ON/OFF states of respective LED light emitting surfaces on the LED array board 601 is formed on the paper sheet 1101. A developing unit 1013 develops a dot image thus formed on the paper sheet 1101. Since the light emission efficiency of end face light emitting LEDs is good, this construction according to the present invention can be effectively used in a system which must use paper with a poor sensitivity.

Figure 16:
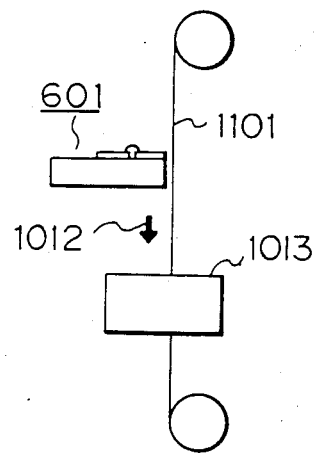
Figure 17:
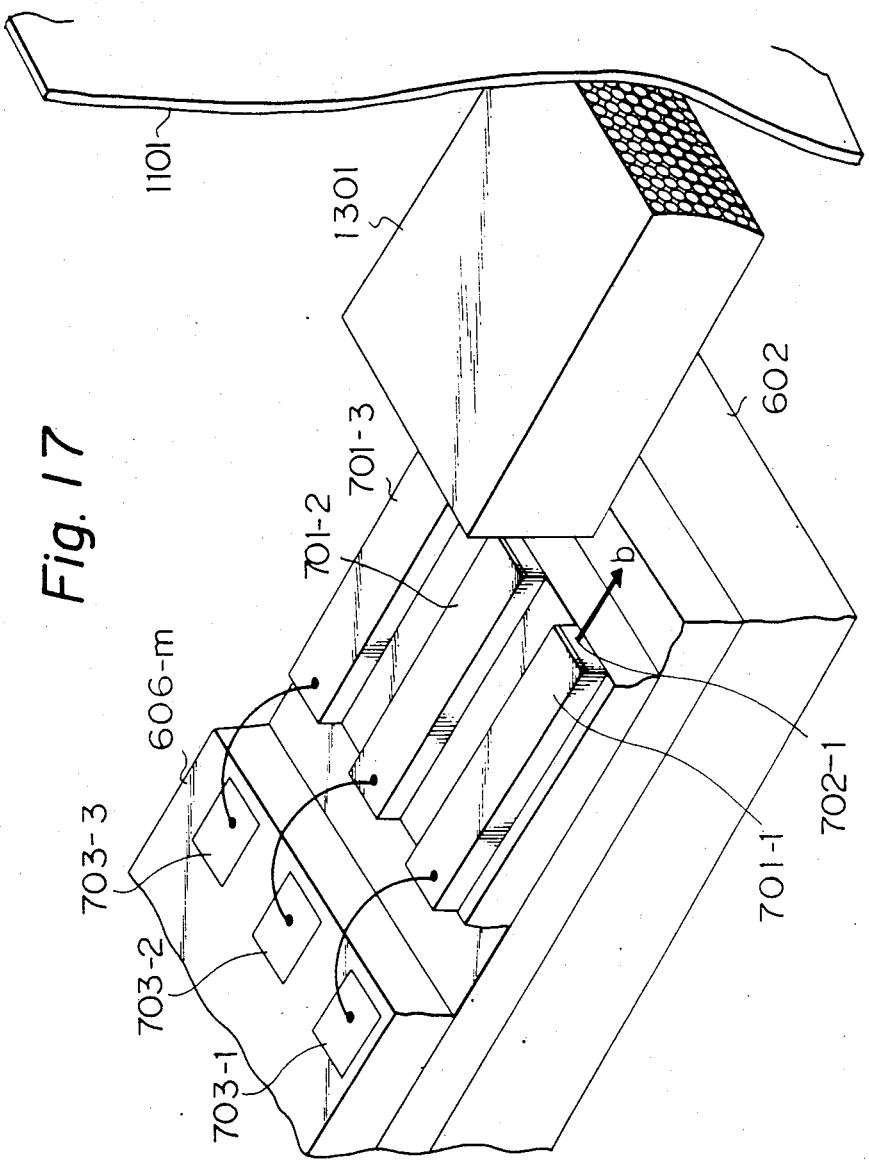
FIGS. 17, 18 and 19 are schematic views showing a construction according to the present invention wherein a fiber plate is used.

FIG. 16 shows still another embodiment of the present invention. In this embodiment, an imaging optical system 401 shown in FIG. 15 is removed. An LED array board 601 is brought into contact with or is located very close to a photosensitive paper sheet 1101. Thus, an ON/OFF pattern of the LED light emitting surfaces is exposed to form an image on the photosensitive paper sheet 1101. When the electrophotographic method (particularly when a photosensitive drum or belt is used), toner remains on the drum or belt after image formation. Therefore, when the LED array board is brought into contact with or is located near the paper sheet, the toner easily contaminates the LED light emitting surfaces. However, when the board 601 is brought into direct contact with the photosensitive paper sheet as in this embodiment, this problem does not occur. Furthermore, since the imaging optical system is not used, an inexpensive printer can be provided.

Figure 18:
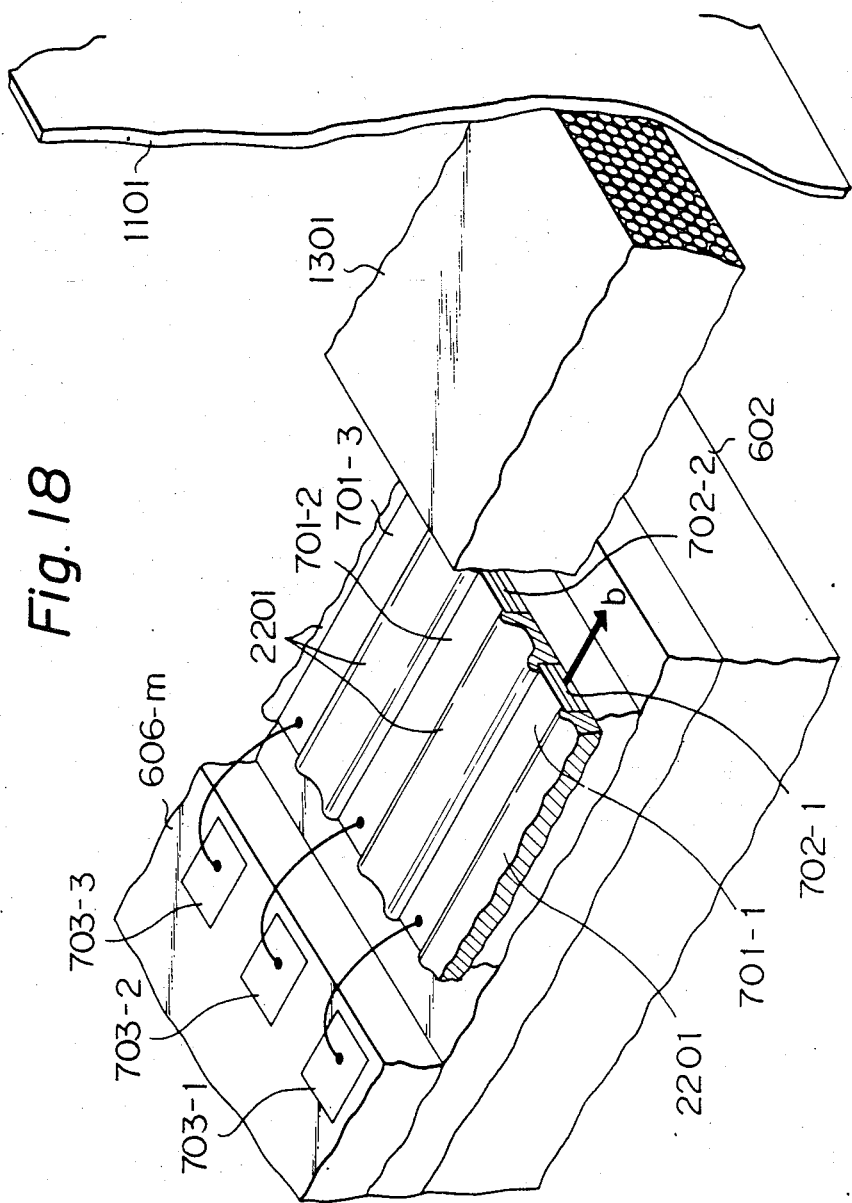
Figure 19:
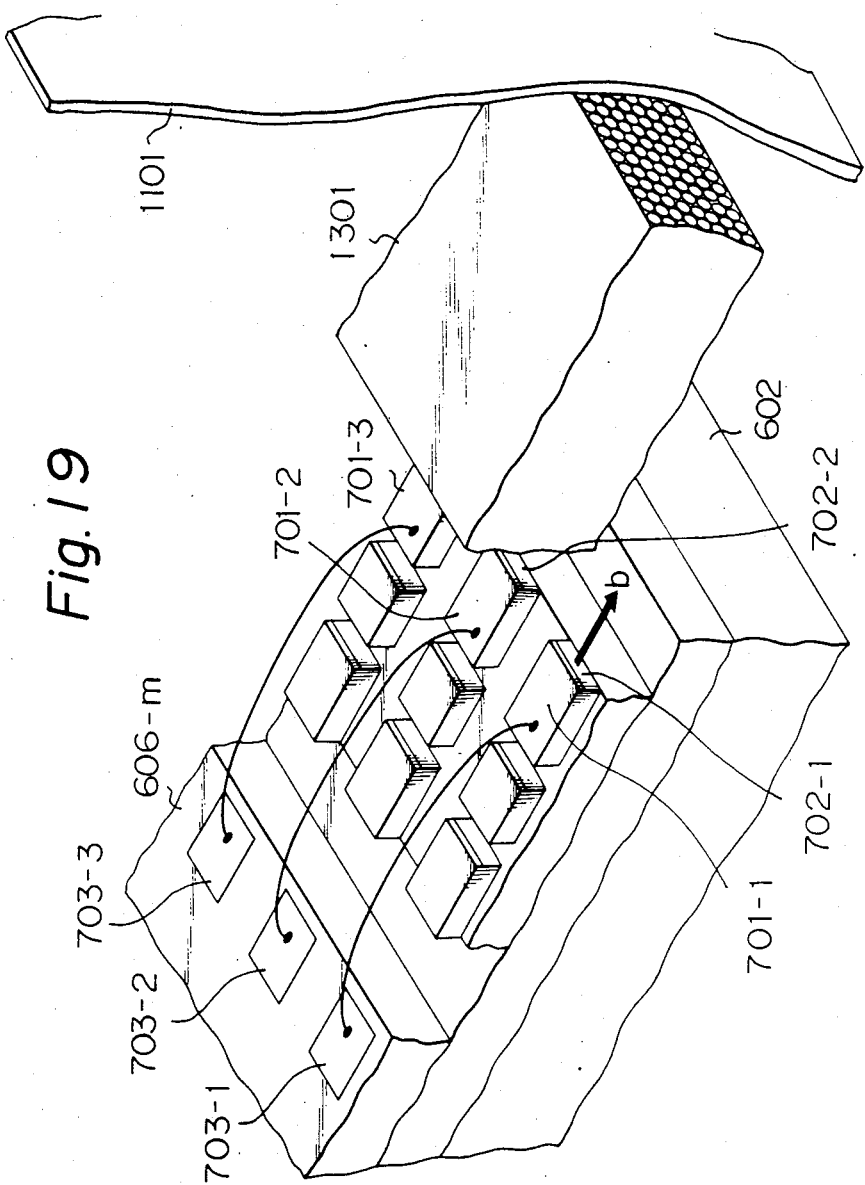

However, if the surface of the photosensitive paper sheet is rough, the LED light emitting surfaces tend to be damaged due to friction with the paper surface. When photosensitive paper having such a rough surface is used or an LED array consists of a fragile material, light can be guided to a photosensitive paper sheet 1101 through a fiber plate 1301 consisting of a bundle of optical fibers. This fiber plate 1301 can be combined with the LED array shown in FIGS. 12 or 13 to provide an image formation apparatus. This is shown in FIGS. 18 or 19.

Figure 20:
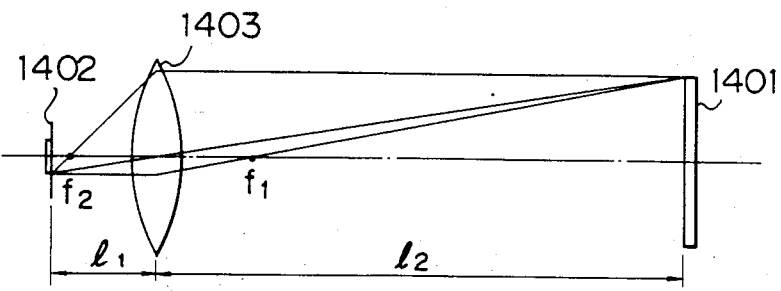
FIG. 20 is a representation showing the relationship between a light emitting portion and a photosensitive drum when the present invention is applied to a microfilm printer.

When an LED array is used in a printer wherein a dot image on a microfilm is exposed, in order to allow use of an imaging optical system such as a focusing light guide, the light emitting surface area must be reduced significantly. In a microfilm, in order to reduce the original area to about 1/20, when the dot density in the projection image is 16 dots/mm, that on the film must be about 320 dots/mm. It is impossible with the current techniques to manufacture such a high-density LED array. Therefore, a reducing optical system must be used to reduce the array of LED light emitting surfaces and a microfilm must be passed in the path of the light bearing the reduced image. FIG. 20 shows such an embodiment.

FIG. 20 shows the relationship between an LED light emitting portion 1401 and an imaging point on a photosensitive film 1402. When focal points of a reducing optical system 1403 are represented by f1 and f2, an image of the LED light emitting portion 1401 at a distance l2 is formed at a distance l1 in the opposite side of the system 1403. The LED light emitting portion 1401 has a small dimension of several tens of micrometers in the subscanning direction, i.e., a direction perpendicular to the LED array but has a large dimension of several hundred of micrometers in the main scanning direction. The reducing optical system 1403 forms an inverted image of the LED array on the photosensitive film 1402. In this construction, in order to effectively utilize light from the LED array, a very big lens must be used. However, such a big lens is non-realistic. Thus, the utilization efficiency of the light emission energy of such a system is low and a light emitting element having a large quantity of light emission must be used. The end face light emitting type LEDs have a high light emission efficiency and can be conveniently used to provide such a system.

Figure 21:
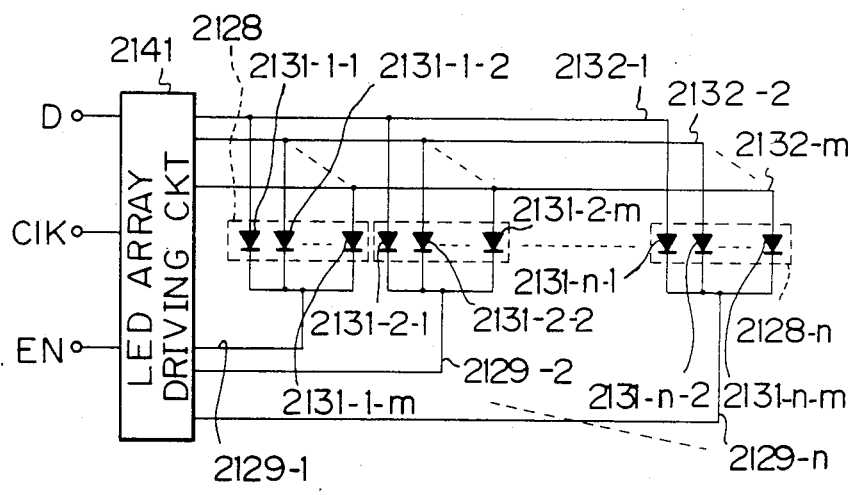
FIG. 21 is a block diagram of an LED array.

The construction of embodiments using LED arrays has been described. However, the method of driving such an LED array will be described below. FIG. 21 shows connection between an LED array driving circuit and the respective LEDs. m LEDs 2131-1-1, ..., 2131-1-m, ..., 2131-n-1, ..., 2131-n-m are formed in each of n LED chips 2128-1 to 2128-n. One end of each LED is connected to a corresponding one of segment signal lines 2132-1 to 2132-m, and the other end thereof is connected to a corresponding one of group selection signal lines 2129-1 to 2129-m, thus forming an n×m matrix wiring. An LED array driving circuit 2141 receives a data signal D, a clock signal Clk and a data enable signal EN.

The operation of the LED array driving circuit 2141 will be described in items (i) to (iii) below.

(i) While the data enable signal EN is "1", data of one array of LEDs 2131-1-1 to 2131-1-m is received in synchronism with the clock signal Clk.

(ii) Upon reception of the first m data, a signal is supplied onto the segment signal lines 2132-1 to 2132-m so as to turn on and off the LEDs 2131-k (where k=1, 2, ..., n) in correspondence with the respective data. At the same time, the group selection signal line 2129-1 is grounded, and the other group selection signal lines 2129-2 to 2129-n are kept floating.

(iii) When the next m data are received, a new signal is supplied onto the segment signal lines 2132-1 to 2132-m. At the same time, the group selection signal line 2129-2 is grounded, and the remaining group selection signal lines are kept floating.

In this manner, data is divided into m portions, and the m×n matrix of LEDs 2131-1-1 to 2131-*n-m* is driven in units of m LEDs (n time division of each group of m LEDs). The data corresponding to the last chip 2128-*n* is held on the segment signal lines 2132-1 to 2132-*m* until m clock signals Clk are counted. The group selection signal line 2129-*n* is grounded, and is thereafter floated.

Figure 22:
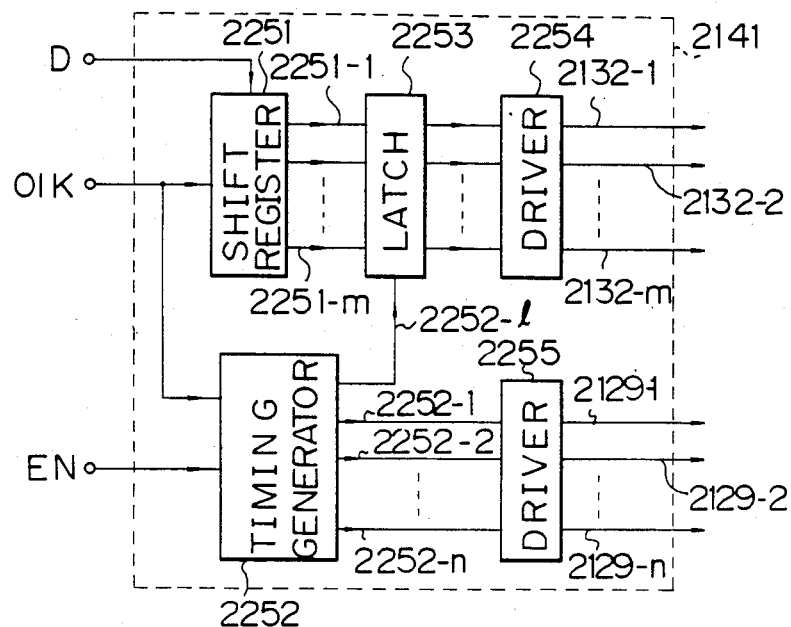
FIG. 22 is a block diagram of an LED array driving circuit.

Referring to FIG. 22, the operation of the LED array driving circuit 2141 will be described in mode detail. FIG. 22 is a block diagram showing an example of the configuration of the LED array driving circuit 2141. The data signal D is supplied to a serial input terminal of a shift register 2251 of serial-in parallel-out type. The clock signal Clk is connected to the shift register 2251 and a timing generator 2252. The enable signal EN is connected to the timing generator 2252. Before the enable signal EN rises, the timing generator 2252 keeps all a latch signal line 2252-l and the group selection signal lines 2252-1 to 2252-*n* at "0". This operation will be described in items (i) to (iv) below. (i) After the timing generator 2252 counts m clock pulses since the leading edge of the enable signal EN, m data appear at the parallel outputs 2251-1 to 2251-*m* of the shift register (ii) At this timing, a pulse is supplied onto the latch signal line 2252-l. (iii) At the same time, the group selection signal line 2252-1 is set at "1". Therefore, a latch 2253 latches the first m data, and a driver 2254 supplies a signal for driving the LEDs 131-1-1 to 2131-1-*m* onto the segment signal lines 2132-1 to 2132-*m*. (iv) Another driver 2255 grounds the group selection signal line 2129-1, and the remaining group selection signal lines 2129-2 to 2129-*m* are kept in the floating state. Thereafter, the timing generator 2252 counts m clock pulses Clk after the leading edge of the enable signal EN, and changes the group selection signal line 2252-*n* from "1" to "0". Thus, all the group selection signal lines 2129-1 to 2129-*m* are set in the floating state.

Figure 23:
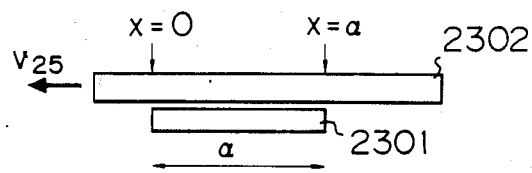
FIG. 23 is a sectional view showing a photosensitive drum and a light emitting element.
Figure 24:
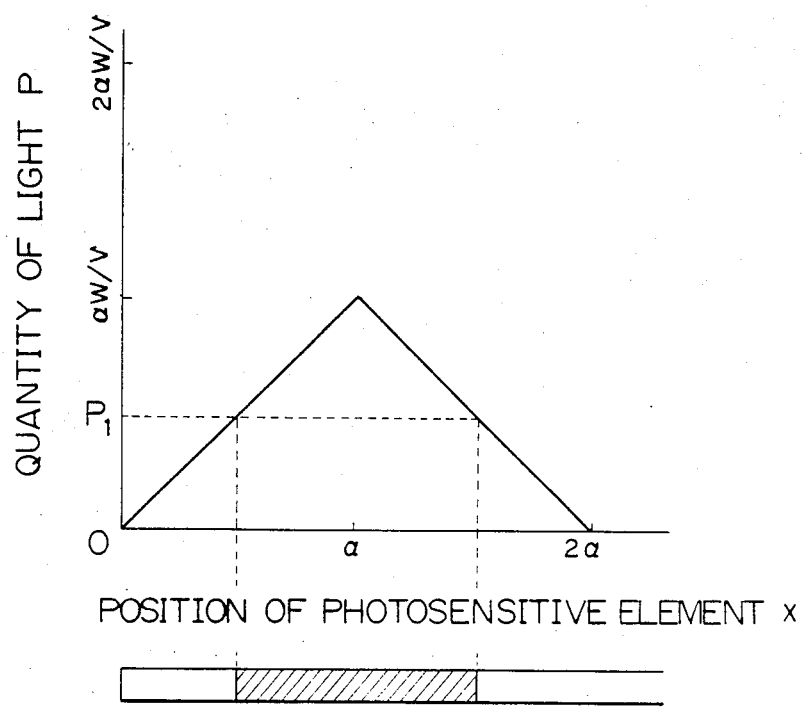
FIGS. 24 and 25 show the distribution of quantity of light on the drum surface.
Figure 25:
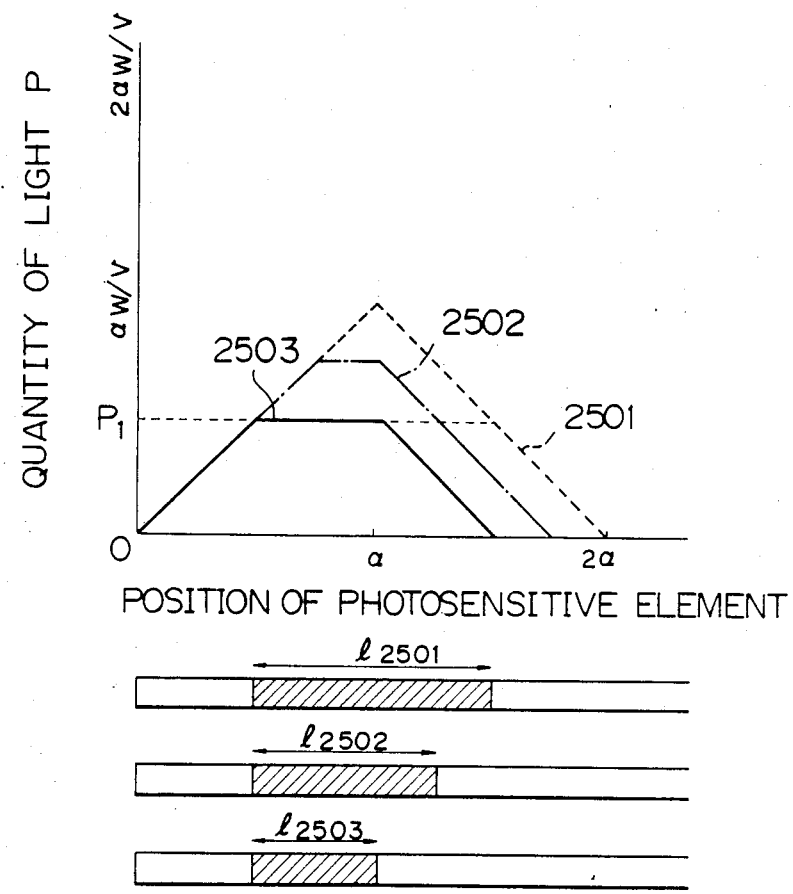

The image formation operation in the image formation apparatus described above will be described below. Referring to FIGS. 23 to 25, the relationship between a general light emitting surface and a formed image will be described.

FIG. 23 shows the relationship between a photosensitive body and a light emitting element when they are cut in a section perpendicular to the scanning direction. The light emitting surface of an LED 2301 opposes the photosensitive surface of a photosensitive body 2302. When an image of a light emitting surface is formed on a photosensitive body through an imaging optical system, the position of the surface receiving light is the same. Therefore, the relationship between the position of the photosensitive body and the quantity light irradiated onto this body will be described.

The dot pitch is represented by $\alpha$ and each dimension of the light emitting surface is also represented by $\alpha$. It is assumed that the photosensitive body 2302 is moving at a predetermined speed V25 in the direction pointed with an arrow. It is also assumed that the surface of the LED 2301 emits uniform light and the illuminance on the photosensitive body surface is represented by W. Therefore, it can be assumed that there will be no change in the main scanning direction, that is, no change in the speed V25 and the vertical direction. The irradiation light quantity distribution at various photosensitive drum positions in the subscanning direction will be examined.

Quantity of light P(x) at position x is given by:

$$P(x) = \int_0^\infty L(x,t)dt$$

where t is time and L(x, t) is the illuminance at the position x.

The position on the photosensitive drum which is on the left end of the LED 2301 immediately before the LED 2301 is turned on is defined as 0 and the direction to the right from this position is defined as the positive direction.

When a one dot image is to be formed, while the photosensitive drum is moved for a distance corresponding to one dot pitch, the LED 2301 is turned on from t=0 to t=d/v. At this time, since when $0 \leq x < \alpha$ and $0 \leq t < x/v$, L(x, t)=W and when $0 \leq x < \alpha$ and $x/v \leq t < \infty$, L(x,t), $$\text{if } 0 \leq x \leq \alpha, P(x) = \int_0^{x/v} Wdt = Wx/v$$

since when $\alpha \leq x < 2\alpha$ and $0 \leq t < (x-\alpha)/v$, L(x, t)=0, when $\alpha \leq x \leq 2\alpha$ and $(x-\alpha)/v \leq t < \alpha/v$, L(x, t) W, and when $\alpha \leq x \leq 2\alpha$ and $\alpha/v \leq t$, L(x,t)=0

$$\text{when } \alpha \leq x \leq 2\alpha, P(x) = \int_{x-\alpha/v}^{\alpha/v} Wdt = (2\alpha - x)W/v$$

FIG. 24 shows such light distribution characteristics.

In order to obtain a black-and-white pattern with such light distribution characteristics, development must be performed to provide great density changes such that a region corresponding to a quantity of light below a quantity of light P1 is printed in black and a region corresponding to a quantity of light above the quantity of light P1 is printed in white.

In this case, even if the value of quantity of light P1 changes slightly, the width of the dot in the subscanning direction is largely changed. In addition, even if the value of the quantity of light P1 is set correctly, the illuminance of each light emitting surface varies. This results in variations in the illuminance W. Then, the peak of the light distribution curve is shifted, and the slope of this curve is also changed largely. Thus, the width of the dot in the subscanning direction with respect to each portion in the main scanning direction varies.

Particularly when the present invention is applied to an optical printer wherein the dot diameter in the subscanning direction is changed by the ON time therefor and a pseudo halftone image is formed, the above-mentioned variations present a problem.

When the light emitting element for the dot is turned on for a time period 1/n, the light quantity distribution can be obtained as:
when $0 \leq x < \alpha/n$, P(x)=Wx/v
when $\alpha/n \leq x < \alpha$, P(x)=(1/n)W$\alpha$/v
when $\alpha \leq x \leq \alpha(1+1/n)$, P(x)={$\alpha$(1+1/n)−x}w/v
when $\alpha(1+1/n) \leq x$, P(x)=0

FIG. 25 shows a distribution 2501 when the element is turned on from t=1 to t=$\alpha$/v, a distribution 2502 when the element is turned on from t=0 to t=(⅔)$\alpha$/v, and a distribution 2503 when the element is turned on from t=0 to t=(⅓)$\alpha$/v.

As described in FIG. 24, when the quantity light at the boundary between black and white regions is defined as P1, the dot width for the distribution 2501 is l2501, that for the distribution 2502 is l2502, and that for the distribution 2503 is l2503. Such dot width varies in accordance with variations in the light emitting surface or errors in the quantity of light P1. In addition, in the distribution 2503, when the quantity of light P1 is increased slightly, the dot width 2503 may become 0. Therefore, a dot width of a limited size of ½ or less the normal width cannot be formed, and a satisfactory halftone image cannot be formed. In order to reproduce a dot having a width of ½ or less the normal width, the quantity of light P1 can be decreased. However, if the element is turned on from $t=1$ to $t=\alpha/v$, the dot width exceeds the pixel pitch. Then, the range of changes in the ON time is narrowed, and the gray level control becomes difficult.

In such a case, when an end face light emitting type LED is used as a light emitting element, an image formation apparatus is realized in which the dot width variation in the subscanning direction is small and an excellent pseudo halftone image can be formed.

Figure 26:
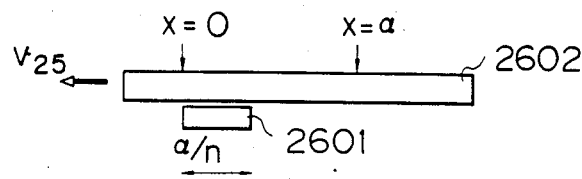
FIG. 26 is a sectional view showing a photosensitive drum and a light emitting element when the light emitting element is short in the subscanning direction.

The end face light emitting type LED has a greater dimension in the direction perpendicular to the array direction (i.e., in the subscanning direction) as compared to that in the direction of the array (i.e., the main scanning direction). This LED is also capable of high-output light emission without a decrease in its life. Therefore, in the invention shown in FIGS. 23 and 24, an arrangement can be adopted wherein the width of the light emitting portion in the subscanning direction is reduced to 1/n and the illuminance is increased n times. The image formation mode in this case is illustrated in FIG. 26 showing an end face light emitting type LED 2601 and a photosensitive body 2602.

When the illuminance is increased n times and the width of the light emitting portion in the subscanning direction is reduced to 1/n, the quantity of light is obtained as follows:

when $0 \leq x \leq \alpha/n$, $P(x) = nwx/v$
when $\alpha \leq x \leq d/v$, $P(x) = \alpha w/v$
when $\alpha \leq x \leq \alpha(1+1/n)$, $P(x) = \{(1+1/n)-x)\}nw/v$
when $\alpha(1+1/n) \leq x$, $P(x) = 0$.

Figure 27:
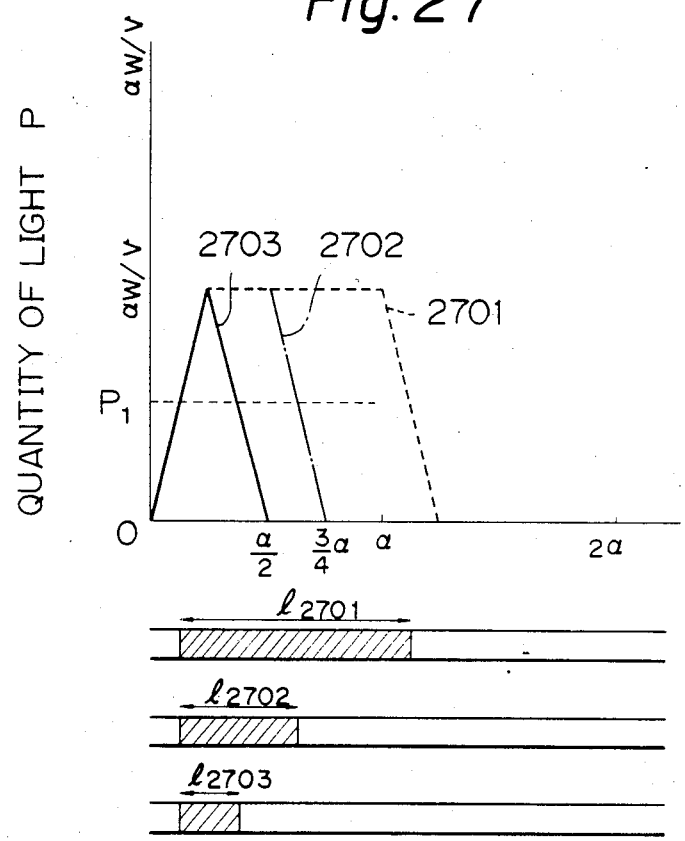
FIG. 27 shows the distribution of quantity of light on the drum surface in the construction of FIG. 26.

FIG. 27 shows a distribution 2701 when the element is turned on from $t=0$ to $t=\alpha/v$, a distribution 2702 when the element is turned on from $t=0$ to $t=(½)\alpha/t$, and a distribution 2703 when the element is turned on from $t=0$ to $t=(¼)\alpha/v$, all when $n=4$.

As described with reference to FIG. 24, when the quantity of light at the boundary between the black and white regions is defined as P1, the dot width for the distribution 2701 becomes l2701, that for the distribution 2702 becomes l2702, and that for the distribution 2703 becomes l2703. In these distribution curves, since the slopes with respect to the X-axis are larger than those in FIG. 25, the range of change in dot width with changes in the illuminance W is considerably reduced. Since the curve l2703 corresponds to (¼)α, the dot width control from (¼)α to α in the subscanning direction can be performed easily. At this time, n is preferably 2 or more from the dot width control point. If the illuminance of the light emitting surface can be increased, n is preferably large. In other words, the dimension of the light emitting portion in the direction perpendicular to the array direction is preferably set to be ½ or less of that along the array direction.

Figure 28:
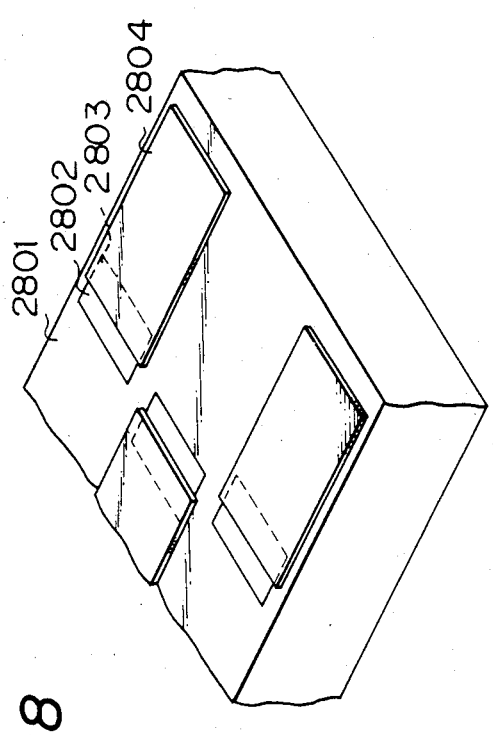
FIG. 28 is a schematic perspective view showing a construction wherein a light emitting surface short in the subscanning direction is used.

In the above description, the case of end face light emitting type LEDs is described. However, a light emitting element having a light emitting surface longer in the main scanning direction can be realized with a conventional LED as shown in FIG. 28. FIG. 28 shows an LED chip 2801, a light emitting surface 2802, an LED connecting portion 2803, and an electrode 2804. However, in this case, since the ratio of the illuminance on the photosensitive body surface to the power consumption is small, a relatively good effect is obtained with a low-speed printer. However, end face light emitting type LEDs are more conveniently used for a high-speed printer or for a compact LED head including a heat radiating means. When a liquid crystal shutter array is used as a light emitting element, the shutter has a dimension in the direction perpendicular to the array direction smaller than that in the array direction. Thus, the above description is also applied to this case.

Figure 29:
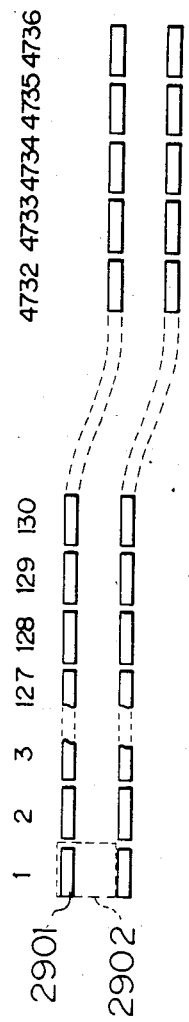
FIG. 29 is a model view showing the dot formation results when end face light emitting LEDs are used.

In this case, when the dimension of the light emitting surface along the main scanning direction is set to be larger than that in the main scanning direction, variations in the dot width in the subscanning direction are reduced. However, when time division drive within one dot is not performed, this arrangement results in another problem. When the LED is turned on while the LED array and the photosensitive body are moved relative to each other at a predetermined speed, the photosensitive body is moved only for a distance ¼ the dot width during the ON time of the LED. Therefore, even when the LED is turned on for the normal period of time, as shown in FIG. 29, only a region 2901 which is about ¼ a one-pixel region 2902 is irradiated with light. In a printer wherein a light irradiated region is printed in black, a white stripe may be formed in an image which is expected to be a totally black image. Conversely, in a printer wherein a light irradiated region is printed in white, a black stripe may be formed in an image which is expected to be a totally white image.

Figure 30A:
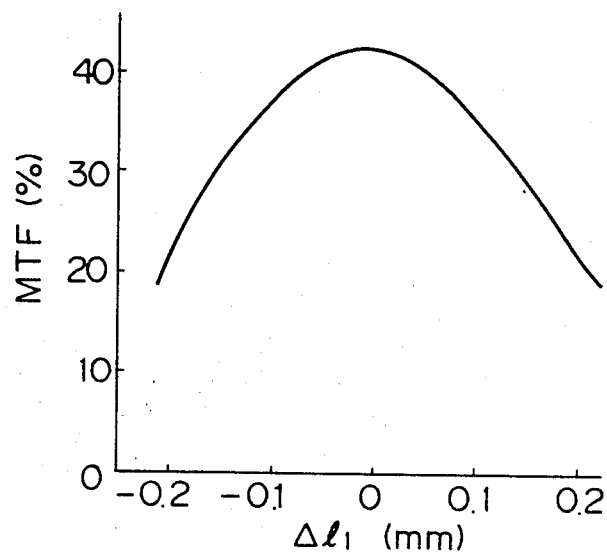
FIGS. 30(a) and 30(b) are graphs showing changes in the MTF.
Figure 30B:
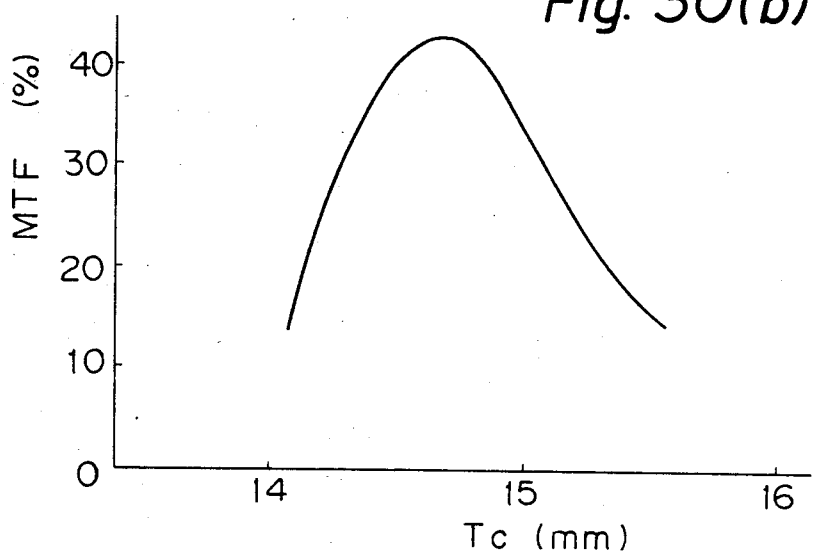

This problem will be described in more detail based on FIG. 30 taking the arrangement of FIG. 10 as an example. Referring to FIG. 10, a sum of a distance L0 between the output surface of the imaging optical system 401 and the surface of the photosensitive drum 101, a length lc of the imaging optical system 401, and a distance li between the input surface of the imaging optical system 401 and the LED light emitting surface 402-1 is set to be the conjugate length of the imaging optical system 401. When the distances l0 and li are set to be the same, a clearer image of the LED light emitting surface 702-1 is formed on the drum 101. Then, the imaging point can be deviated from the normal position on purpose to blur the image on the drum 101 and to form an image larger than the light emitting surface 702-1 of the LED 701-1. This is performed utilizing the fact that when the object point is deviated from the conjugate point of the imaging optical system 401, the MTF is reduced. FIG. 30(a) shows changes in the MTF when the LED light emitting surface 702-1 or the surface of the drum 101 is moved away (+) or toward (−) by Δl1 from the imaging optical system 401 from the in-focus state. FIG. 30(b) shows the same when the Tc is changed under the condition l0=li where Tc is the distance between the LED light emitting surface 702-1 and the surface of the drum 101. In this manner, the MTF can be reduced and the size of image can be increased by changing the distance between the imaging optical system 401 and the light emitting surface 702-1 or drum 101. In the above case, the image is enlarged in both the longitudinal direction (main scanning direction) of the LED 701-1 and in the transverse direction (subscanning direction) thereof.

Figures 31A, 31B, 31C:
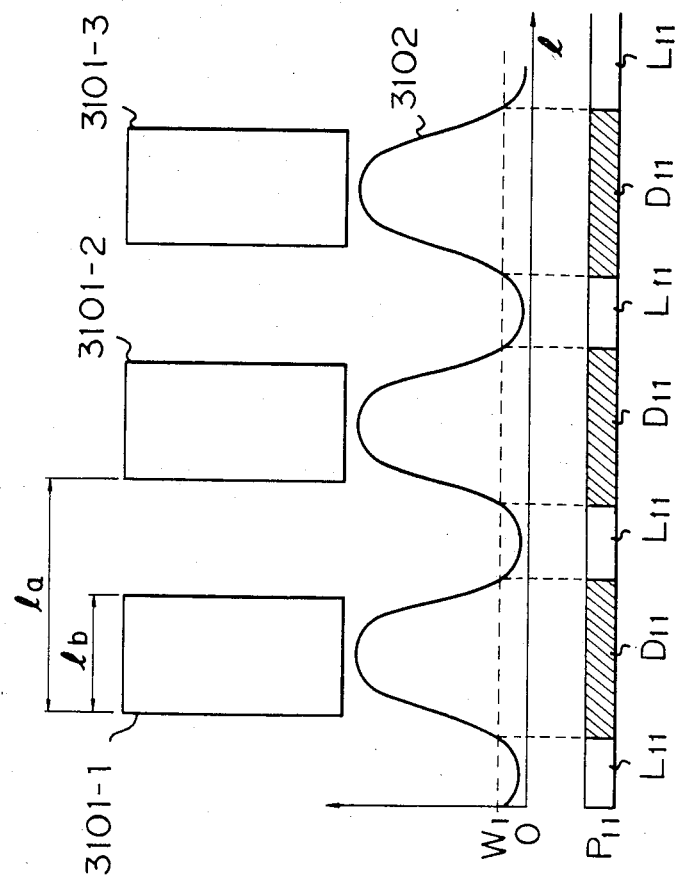
FIG. 31 shows the relationship between the light emission pattern and the optical energy on the drum.

The above problem will be described in more detail with reference to FIG. 31. FIGS. 31(a) to 31(g) show the relationship between the optical energy distribution and the image patterns when each LED array is turned on or some arrays are not turned on. As shown in FIG. 31(a), when LEDs are turned on at an ON position 3101-1 for the first array, an ON position 3101-2 for the second array, and an ON position 3101-3 for the third array, the light emission width lb is shorter than the pixel pitch la. Then, the distribution of the optical energy on the drum 101 becomes as indicated by curve 3102 in FIG. 31(b). Even if the optical energy threshold value as a boundary between the printing and non-printing regions is set to be as small as W1, printing regions D11 and non-printing regions L11 are formed as indicated by a printing state P11 in FIG. 31(c). In this case, a region irradiated with light is described to be a printing region. However, as is well known, the printing and non-printing regions can be reversed if the electrophotographic process is modified.

Figures 31D, 31E, 31F, 31G:
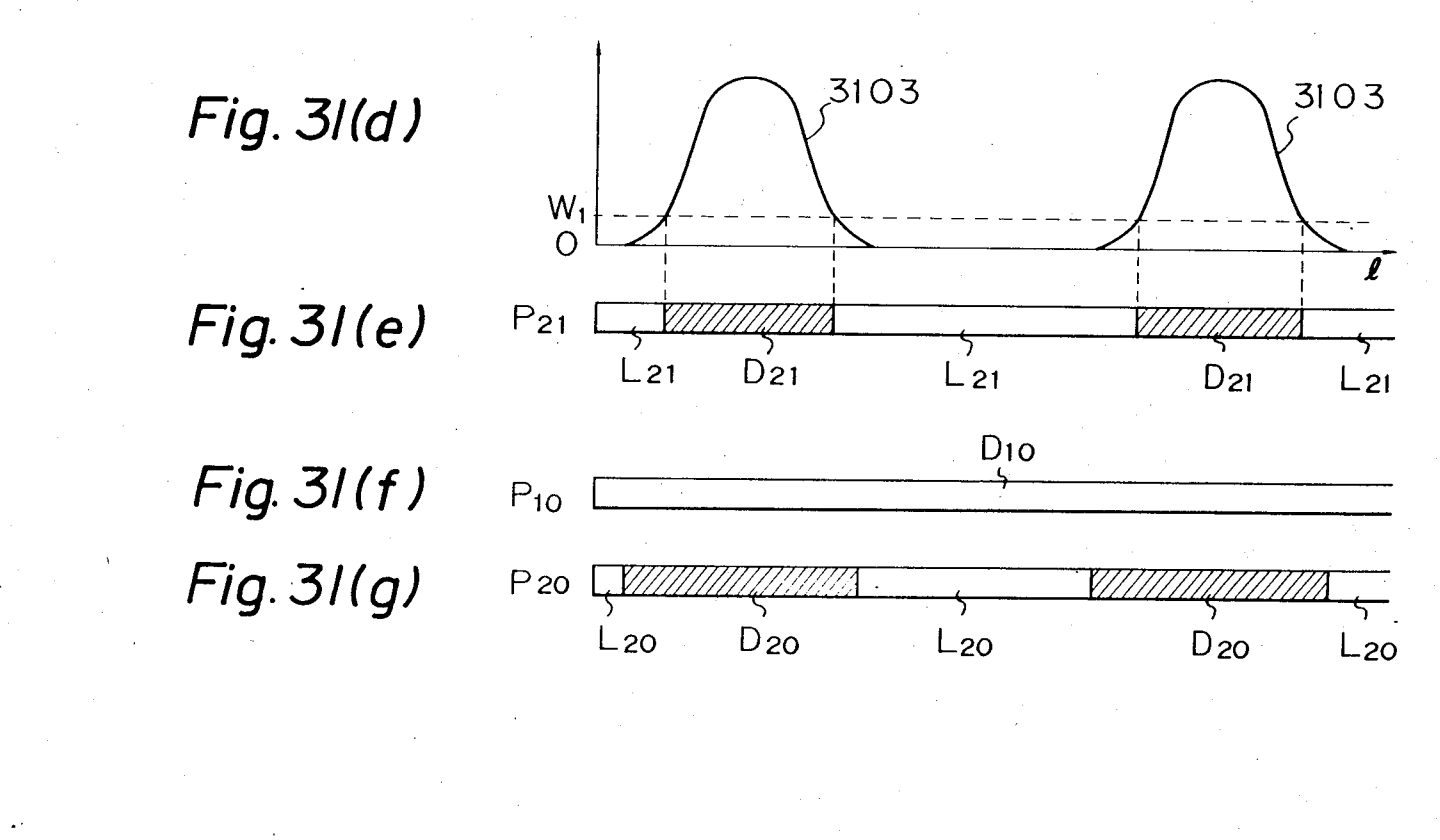

When only the LEDs of the second array at the ON position 3101 are turned off, the optical energy on the drum 101 becomes as indicated by curve 3103 shown in FIG. 31(d). In a printing state P21 of this case, as shown in FIG. 31(e), a non-printing region L21 becomes narrower than a printing region D21. Normally, when the LEDs are continuously driven, the printing regions D10 must continue for a line as in a printing state P10 shown in FIG. 31(f). When the LEDs are not turned on once in every two ON positions, a non-printing region L20 and a printing region D20 must have the same width. This mixing of the printing and non-printing regions in an undesirable ratio results in formation of a white or black stripe in a black or white image.

Figure 32:
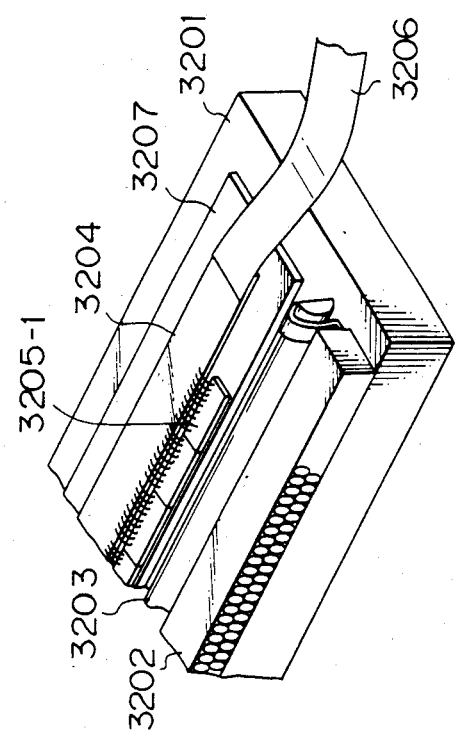
FIG. 32 is a perspective view showing the main part of still another embodiment of the present invention wherein a cylindrical lens is used.

FIG. 32 shows a perspective view of still another embodiment of the present invention wherein such a white or black stripe is not formed. In this embodiment, a means for reducing the MTF of the image formed on a photosensitive body only in the subscanning direction is arranged between the LED array and the photosensitive body. Therefore, even of LEDs have greater dimensions in the main scanning direction than in the subscanning direction, the light from the LEDs forms an image enlarged in the subscanning direction on the photosensitive body.

Referring to FIG. 32, a substrate 3201 is extended in the light emitting direction of LED array chips 605-1 and so on so as to mount an imaging optical system 3202 such as a focusing light guide. A cylindrical lens 3203 is fixed between the imaging optical system 3202 and LED array chips 3205-1 and so on. FIG. 32 also illustrates a wiring means 3204 for segment signal lines, a cable 3206 for connecting each segment signal line from the wiring means 3204, and a wiring means 3207 for group selection signal lines and comprising a ceramic substrate or the like.

Even if the cylindrical lens 3203 is inserted, the imaging state of the imaging optical system 3202 in the array direction of the LED array chips 3205-1 and so on remains the same. However, in the direction perpendicular to the array direction of the LED array chips 3205-1 and so on, i.e., the direction of short sides of the light emitting surfaces, the optical path is changed and the image on the drum is blurred and enlarged upon insertion of the cylindrical lens 3203. In an imaging optical system including the cylindrical lens 3203, the MTF in the longitudinal direction (main scanning direction) of the light emitting surface of the LED 3205-1 or the like remains the same while that in the transverse direction thereof (subscanning direction) is decreased.

Figures 33D, 33E:
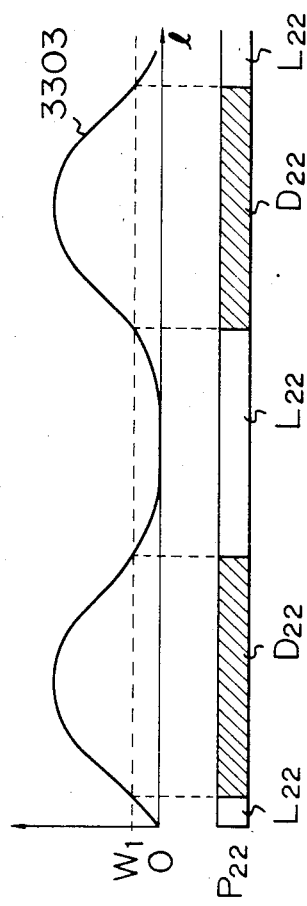
FIG. 33 shows the relationship between a light emission pattern and the optical energy on the drum surface in the embodiment shown in FIG. 32.

Referring to FIG. 32, when the cylindrical lens 3203 is inserted between the imaging optical system 3202 and the LED array chip 3205-1, the optical path of light emerging from the LED array chip 3205-1 is modified in the direction perpendicular to the axis of the cylindrical lens. Therefore, in the imaging performance in the transverse direction of the light emitting surface of the LED array chip 3205-1, the same effect when the distance between the imaging optical system 3202 and the LRF 3205-1 is changed is obtained as shown in FIG. 30. However, the optical path is not changed in the axial direction of the cylindrical lens 3203. Therefore, the image can be enlarged only in the transverse direction (subscanning direction) of the LED light emitting surface. This is shown in FIG. 33. When all the LEDs are turned on, i.e., when the LEDs are turned on at all ON positions 3301-1, 3301-2 and 3301-3 in FIG. 33(a), the optical energy distribution on the drum 101 becomes as indicated by curve 3302 in FIG. 33(b). This is due to the following reason. Since the MTF of the imaging optical system is reduced, the contrast is reduced. Then, the optical energy is deviated from the optical energy distribution 3302 shown in FIG. 33(b). As in the case of FIG. 31, the threshold value of the optical energy as a boundary between printing and non-printing regions is represented by W1. Then, a printing state P12 shown in FIG. 33(c) involves only printing regions D12. However, when LEDs are turned off once in two ON positions, that is, when the LEDs are turn on at the ON positions 3301-1 and 3301-3 and turned off at the ON position 3301-2, the optical energy distribution on the drum 101 becomes as indicated by curve 3303 in FIG. 33(d). In this case, a printing state P22 as shown in FIG. 33(e) is obtained wherein non-printing regions L22 and printing regions D22 are alternately formed to have substantially the same width.

In this manner, when the imaging optical system is defocused in the subscanning direction to reduce the MTF and the optical energy distribution on the drum is modified, printing states P12 and P22 when all the LEDs are turned and some LEDs are turned off can approach ideal printing states P10 and P20 shown in FIG. 31 even if an image forming exposure apparatus having a relatively non-light emitting surface width is used.

In this case, the electrophotographic method must be selected to provide printing and non-printing regions in accordance with the threshold value W1.

Figure 34:
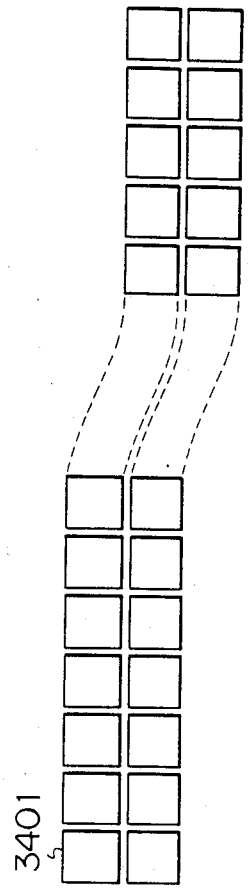
FIG. 34 shows a dot pattern formed in the embodiment shown in FIG. 32.

In this manner, the image when all the LEDs are ON become as shown in FIG. 34 wherein light is irradiated onto the entire single-pixel region 3401.

The same effect is obtained irrespective of the position of the cylindrical lens 3203 between the LED array chip 3205-1 and the drum.

Figure 35:
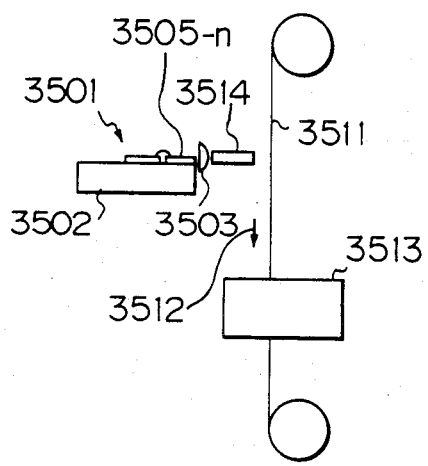
FIG. 35 is a view showing the construction in accordance with still another embodiment of the present invention.

FIG. 35 shows still another embodiment of the present invention. In this embodiment, a photosensitive paper sheet 3511 is opposed to an LED array board 3501 wherein end face light emitting type LED array chips 3505-1 to 3505-n are mounted on a substrate 3502. Light from the LED array chips 3505-1 to 3505-n is imaged on the sheet 3511 by an imaging optical system 3514 through a cylindrical lens 3514. The paper sheet 3511 is moved in the direction of arrow 3512, and an image as a collective body of light spots corresponding to ON/OFF states of the LEDs on the LED array board 3501 is formed sequentially. A developing unit 3513 develops and fixes the dot image on the paper sheet 3511 which is formed by the LED array board 3501.

In this manner, the present invention is not limited to an electrophotographic printer but can be applied to a printer wherein an image is formed by exposure and is developed and fixed. A black or white stripe as described above can be eliminated.

Figure 36:
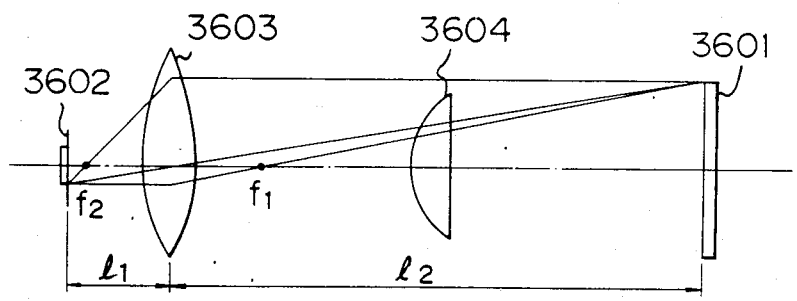
FIG. 36 is a schematic view showing the relationship between an LED light emission portion and a photosensitive film imaging point in still another embodiment using a cylindrical lens.

An arrangement including a cylindrical lens can be conveniently used in a printer wherein a dot image on a microfilm is exposed as in the case described with reference to FIG. 20. FIG. 36 shows the relationship between an LED light emitting portion 3601 and an imaging point on a photosensitive film 3602 in this case. When focal points of a reducing optical system 3603 are represented by f1 and f2, the LED light emitting portion 3601 at a distance l2 forms an image at a distance l1 in the opposite side of the system 3603. The LED light emitting portion 3601 is as short as several tens of micrometers in the subscanning direction, i.e., the direction perpendicular to the LED array but is as long as several hundred micrometers in the scanning direction.

The arrangement of reducing the MTF only in the subscanning direction is not limited to end face light emitting type LEDs. Formation of black stripes can be prevented in a similar manner with any other type of LEDs having light emitting surfaces longer in the main scanning direction than in the subscanning direction.

The means for reducing the MTF in the subscanning direction can be, in place of a cylindrical lens as described above, an anamorphic optical system having different imaging positions in the longitudinal and transverse directions.

What is claimed is:

1. An image formation apparatus comprising;
   a photosensitive body;
   a light-emitting diode array for exposing said photosensitive body, said array consisting of at least one array each consisting of a plurality of light-emitting diodes for emitting light from end faces thereof perpendicular to p-n junction planes thereof, said light emitting end face of each said diode having a shape such that a length of said end face in a direction perpendicualr to an array direction of the array of said diodes is shorter than that in the array direction; and
   control means for selectively turning on said light-emitting diodes of said light-emitting diode array so as to form a dot image on said photosensitive body.

2. An apparatus according to claim 1, wherein said photosensitive body and said light emitting diode array are moved relative to each other in a direction substantially perpendicular to an array direction of said light-emitting diode array.

3. An apparatus according to claim 1, further comprising an imaging optical system for forming images of said light-emitting end faces of said light-emitting diodes onto said photosensitive body.

4. An apparatus according to claim 3, wherein said imaging optical system comprises a converging light transmitter array.

5. An apparatus according to claim 3, wherein said imaging optical system forms reduced images of said light emitting end faces on said photosensitive body.

6. An apparatus according to claim 1, wherein said control means includes a driving circuit for driving said light-emitting diodes and said driving circuit is fixed on a common substrate together with said light-emitting diode array.

7. An image formation apparatus comprising:
   a photosensitive body;
   a light emitting diode array for exposing said photosensitive body, said array consisting of at least one array each consisting of a plurality of light-emitting diodes which emit light from end faces thereof perpendicular to p-n junction planes thereof and which are formed by being separated by grooves, a light absorbing member being coated to cover at least side surfaces of said grooves, said light emitting end face of each said diode having a shape such that a length of said end face in a direction perpendicular to an array direction of the array of said diodes is shorter than that in the array direction; and
   control means for selectively turning on said light-emitting diodes of said light-emitting diode array so as to form a dot image on said photosensitive body.

8. An apparatus according to claim 7, wherein each of said light-emitting diodes of said light-emitting diode array is formed monolithically on said substrate, and said grooves are formed on said substrate to separate said p-n junction planes of said light-emitting diodes.

9. An apparatus according to claim 7, wherein said grooves of said light-emitting diodes are buried with the light absorbing member.

10. An apparatus according to claim 7, wherein said photosensitive body and said light-emitting diode array are moved relative to each other in a direction substantially perpendicular to an array direction of said light-emitting diode array.

11. An apparatus according to claim 7, further comprising an imaging optical system for forming images of said light-emitting end faces of said light-emitting diodes onto said photosensitive body.

12. An apparatus according to claim 7, further comprising a fiber plate for guiding light from said light-emitting diode array to said photosensitive body and consisting of a closely packed bundle of optical fiber.

13. An image formation apparatus comprising:
   a photosensitive body;
   a substrate;
   a light-emitting diode array for exposing said photosensitive body and fixed on said substrate, said array consisting of at least one array each consisting of a plurality of light-emitting diodes for emitting light from end faces thereof perpendicular to p-n junction planes thereof, said light emitting end face of each said diode having a shape such that a length of said end face in a direction perpendicular to an array direction of the array of said diodes is shorter than that in the array direction;
   an imaging optical system for forming images of said light-emitting end faces of said light-emitting diodes in said diode array on said photosensitive body, said imaging optical system being fixed on a surface of said substrate which is parallel to a surface thereof mounting said light-emitting diode array through a height adjusting plate; and
   control means for selectively turning on said light-emitting diodes of said light-emitting diode array so as to form a dot image on said photosensitive body.

14. An apparatus according to claim 13, wherein said imaging optical system comprises a converging light transmitter array.

15. An image formation apparatus comprising:
a photosensitive body;
a light-emitting diode array for exposing said photosensitive body, said array consisting of at least one array each consisting of a plurality of light-emitting diodes for emitting light from end faces thereof perpendicular to p-n junction plane thereof, said light emitting end face of each said diode having a shape such that a length of said end face in a direction perpendicular to an array direction of the array of said diodes is shorter than in the array direction;
an imaging optical system for forming images of said end faces of said diodes on said photosensitive body;
optical means for reducing a modulation transfer function of the images formed by said imaging optical system in only the direction perpendicular to the array direction;
means for moving said photosensitive body and said diode array relative to each other in the direction substantially perpendicular to the array direction of said diodes; and
control means for selectively driving said diodes of said diode array and for forming a dot image on said photosensitive body.

16. An apparatus according to claim 15, wherein said optical means comprises a cylindrical lens which is interposed between said diode array and said photosensitive body and a shape of which has a generatrix in the array direction.

17. An apparatus according to claim 15, wherein said imaging optical system comprises a converging light transmitter array.

18. An apparatus according to claim 15, wherein sid imaging optical system reduces the images of the light output surfaces and forms the images on said photosensitive body.

19. An apparatus according to claim 1, wherein said end faces of said light-emitting diodes are disposed near said photosensitive body and said photosensitive body is directly exposed to the light emitted from said end faces.

20. An apparatus according to claim 7, wherein said end faces of said light-emitting diodes are disposed near said photosensitive body and said photosensitive body is directly exposed to the light emitted from said end faces.

21. An apparatus according to claim 13, wherein said end faces of said light-emitting diodes are disposed near said photosensitive body and said photosensitive body is directly exposed to the light emitted from said end face.

22. An apparatus according to claim 13, wherein said photosensitive body and said light-emitting diode array are moved relative to each other in a direction substantially perpendicular to an array direction of said light-emitting diode array.

* * * * *

UNITED STATES PATENT AND TRADEMARK OFFICE
CERTIFICATE OF CORRECTION

PATENT NO. : 4,700,206

DATED : October 13, 1987

INVENTOR(S) : TADASHI YAMAKAWA

It is certified that error appears in the above-identified patent and that said Letters Patent is hereby corrected as shown below:

COLUMN 2
    Line 2, "C209--m" should read --209-m --.
    Line 42, "insert --when-- after "even";
    Line 45, "reach" should read --reaches--.
    Line 65, "at" should read --as--.

COLUMN 3
    Line 45, "of" should read --is--.

COLUMN 7
    Line 5, "605 2," should read --605-2,--.
    Line 12, "605-mand" should read
--605-m and--.
    Line 57, "havinq" should read --having--.

COLUMN 8
    Line 50, "in short" should read --in a
short--.

COLUMN 9
    Line 2, delete "is used".
    Line 52, "liqht" should read --light--.

UNITED STATES PATENT AND TRADEMARK OFFICE
CERTIFICATE OF CORRECTION

PATENT NO. : 4,700,206
DATED : October 13, 1987
INVENTOR(S) : TADASHI YAMAKAWA

It is certified that error appears in the above-identified patent and that said Letters Patent is hereby corrected as shown below:

COLUMN 12
    Line 24, "hundred" should read --hundreds--.
    Line 68, close up the right margin.

COLUMN 13
    Line 1, close up the left margin.
    Line 8, "mode" should read --more--.
    Line 17, delete "all a".
    Line 23, "ter (ii) should read --ter 2251.(ii).
    Line 27, "131-1-1" should read --2131-1-1--.
    Line 52, "quantity light" should read --quantity of light--.

COLUMN 14
    Line 26, "L(x, t) W," should read --L(x, t) = W,--.

COLUMN 15
    Line 1, "quantity light" should read --quantity of light--.
    Line 9, "2503" should read --$\ell$2503--.
    Line 43, "when $\alpha \leq x \leq d/v$, $P(x)=aw/v$" should read --when $\alpha/n \leq x \leq \alpha$ --.

UNITED STATES PATENT AND TRADEMARK OFFICE
CERTIFICATE OF CORRECTION

PATENT NO. : 4,700,206

DATED : October 13, 1987

INVENTOR(S) : TADASHI YAMAKAWA

It is certified that error appears in the above-identified patent and that said Letters Patent is hereby corrected as shown below:

Line 60, "(1/2)$\alpha$," should read --(1/4)$\alpha$,--.
    Line 61, "(1/2)$\alpha$" should read --(1/4)$\alpha$--.

COLUMN 17
    Lines 9-14, delete italics and replace with Roman lettering.
    Line 44, "of" should read --if--.

COLUMN 18
    Line 15, "LRF 3205-1" should be --LED 3205-1--.
    Line 55, "become" should read --becomes--.
    Line 67, "3514" (first occurrence) should be --3503--.

COLUMN 19
    Line 38, "comprising;" should read --comprising:--.
    Line 45, "light emitting" should read --light-emitting--.
    Line 47, "perpendicualr" should read --perpendicular--.
    Line 55, "light emitting" should read --light-emitting--.

UNITED STATES PATENT AND TRADEMARK OFFICE
CERTIFICATE OF CORRECTION

PATENT NO. : 4,700,206
DATED : October 13, 1987
INVENTOR(S) : TADASHI YAMAKAWA

It is certified that error appears in the above-identified patent and that said Letters Patent is hereby corrected as shown below:

```
    Line 68, "light emitting" should read
--light-emitting--.

COLUMN 20
    Line 14, "light absorbing" should read
--light-absorbing--.
    Line 15, "light emit-" should read
--light-emit- --.
    Line 32, "light absorbing" should read
--light-absorbing--.
    Line 55, "light emitting" should read
--light-emitting--.

COLUMN 21
    Line 13, light emitting" should read
--light-emitting--.
    Line 16, "than in" should read --than that
in--.

COLUMN 22
    Line 9, "sid" should read --said--.
    Line 26, "face." should read --faces--.
```

UNITED STATES PATENT AND TRADEMARK OFFICE
CERTIFICATE OF CORRECTION

PATENT NO. : 4,700,206
DATED : October 13, 1987
INVENTOR(S) : Tadashi Yamakawa

It is certified that error appears in the above-identified patent and that said Letters Patent is hereby corrected as shown below:

<u>56 REFS</u>

"Ohaka et al" should read --Ohara et al.--

Signed and Sealed this

Thirteenth Day of September, 1988

*Attest:*

DONALD J. QUIGG

*Attesting Officer*  *Commissioner of Patents and Trademarks*